(12) United States Patent
Hwang et al.

(10) Patent No.: US 11,111,579 B2
(45) Date of Patent: Sep. 7, 2021

(54) DEPOSITION EQUIPMENT AND METHOD OF FABRICATING SEMICONDUCTOR DEVICE USING THE SAME

(71) Applicant: SAMSUNG ELECTRONICS CO., LTD., Suwon-si (KR)

(72) Inventors: Sun Yong Hwang, Hwaseong-si (KR); Hyun Su Kim, Suwon-si (KR); Eun-Ok Lee, Suwon-si (KR); Taek Jung Kim, Seoul (KR); Hyo Jung Noh, Cheonan-si (KR); Ji Won Yu, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 16/386,970

(22) Filed: Apr. 17, 2019

(65) Prior Publication Data

US 2019/0345606 A1 Nov. 14, 2019

(30) Foreign Application Priority Data

May 10, 2018 (KR) .................. 10-2018-0053889

(51) Int. Cl.
*C23C 16/40* (2006.01)
*C23C 16/455* (2006.01)
*C23C 16/44* (2006.01)

(52) U.S. Cl.
CPC ........ *C23C 16/455* (2013.01); *C23C 16/4408* (2013.01)

(58) Field of Classification Search
CPC .............. C23C 16/455; C23C 16/4408; C23C 16/45521; C23C 16/45525;
(Continued)

(56) References Cited

U.S. PATENT DOCUMENTS 3,793,070 A * 2/1974 Schoolar ................ H01L 21/00
117/108
5,114,529 A * 5/1992 Masuyama ....... H01J 37/32091
118/723 ER
(Continued)

FOREIGN PATENT DOCUMENTS

| JP | 2005-109204 | 4/2005 |
| JP | 4255148 | 4/2009 |
| KR | 1020010095696 | 11/2001 |
| KR | 1020030095525 | 12/2003 |
| KR | 1020080073816 | 8/2008 |
| KR | 101373635 | 3/2014 |

*Primary Examiner* — Rudy Zervigon
(74) *Attorney, Agent, or Firm* — F. Chau & Associates, LLC

(57) ABSTRACT

A deposition equipment is provided. The deposition equipment includes: a reaction chamber including an upper plate and a container body, the upper plate including a gas supplier for injecting a processing gas; a wafer chuck including an upper surface on which a wafer is loaded, in the reaction chamber, with the upper surface of the wafer chuck facing the upper plate; and a processing gas shielding section which prevents the processing gas from being adsorbed to the upper surface of the wafer chuck and is disposed between the upper plate and the wafer chuck in a state in which the wafer is removed from the wafer chuck. The processing gas shielding section includes a shutter which is plate-like, and the shutter includes a region including a gas discharge section for jetting a purging gas toward the wafer chuck.

11 Claims, 30 Drawing Sheets

(58) Field of Classification Search
CPC ............... C23C 16/4581; C23C 14/50; C23C 16/45551; C23C 16/45589; H01L 21/67017; H01L 21/6719; H01L 21/67011
USPC ............ 118/715; 156/345.1, 345.33, 345.34
See application file for complete search history.

(56) References Cited

U.S. PATENT DOCUMENTS

| | | | | |
|---|---|---|---|---|
| 5,143,896 A * | | 9/1992 | Harada | H01L 39/2432 118/665 |
| 5,453,124 A * | | 9/1995 | Moslehi | C23C 16/45561 118/715 |
| 5,968,275 A * | | 10/1999 | Lee | H01J 37/32633 118/504 |
| 6,059,885 A * | | 5/2000 | Ohashi | C23C 16/4401 118/730 |
| 6,132,805 A | | 10/2000 | Moslehi | C23C 14/22 118/720 |
| 6,245,192 B1 * | | 6/2001 | Dhindsa | C23C 16/455 156/345.34 |
| 6,284,049 B1 * | | 9/2001 | Uesugi | C23C 16/52 118/712 |
| 6,325,857 B1 * | | 12/2001 | Miyoshi | C23C 16/345 118/50.1 |
| 6,354,832 B1 * | | 3/2002 | Yoshimura | H01L 21/67109 118/725 |
| 6,432,831 B2 * | | 8/2002 | Dhindsa | C23C 16/455 438/710 |
| 6,663,715 B1 * | | 12/2003 | Yuda | C23C 16/45519 118/723 ER |
| 6,782,843 B2 * | | 8/2004 | Kinnard | C23C 16/4411 118/723 E |
| 6,872,258 B2 * | | 3/2005 | Park | C23C 16/45565 118/715 |
| 7,115,184 B2 * | | 10/2006 | Ohmi | H01J 37/32192 156/345.33 |
| 7,439,192 B2 * | | 10/2008 | Seo | C23C 16/34 257/E21.171 |
| 7,449,416 B2 * | | 11/2008 | Becknell | G03F 7/427 257/E21.256 |
| 7,520,936 B2 * | | 4/2009 | Nagashima | B05D 3/0209 118/643 |
| 7,712,434 B2 * | | 5/2010 | Dhindsa | H01J 37/3244 118/723 E |
| 7,902,090 B2 * | | 3/2011 | Seo | C23C 16/45544 438/795 |
| 7,913,848 B2 | | 3/2011 | Kitaoka et al. | |
| 8,051,548 B2 | | 11/2011 | Miyashita et al. | |
| 8,252,114 B2 * | | 8/2012 | Vukovic | C23C 16/45587 118/715 |
| 8,568,554 B2 * | | 10/2013 | Hayashi | H01J 37/3244 156/345.33 |
| 8,623,172 B2 * | | 1/2014 | Hayashi | H01J 37/32568 156/345.33 |
| 8,663,437 B2 * | | 3/2014 | Yamaguchi | C23C 14/0036 204/298.11 |
| 8,747,610 B2 * | | 6/2014 | Chen | H01J 37/32504 156/345.39 |
| 8,858,754 B2 * | | 10/2014 | Horiguchi | H01J 37/32449 156/345.45 |
| 8,906,160 B2 * | | 12/2014 | Endo | C23C 16/45587 118/715 |
| 8,992,743 B2 * | | 3/2015 | Yamaguchi | H01J 37/3408 204/192.12 |
| 9,252,002 B2 | | 2/2016 | Tsai et al. | |
| 9,312,163 B2 | | 4/2016 | Tanaka et al. | |
| 9,460,893 B2 * | | 10/2016 | Kawamata | C23C 16/4558 |
| 9,605,342 B2 * | | 3/2017 | Alokozai | H01J 37/3244 |
| 10,023,960 B2 * | | 7/2018 | Alokozai | C23C 16/505 |
| 10,184,179 B2 * | | 1/2019 | Kurita | C23C 16/042 |
| 10,529,577 B2 * | | 1/2020 | Ni | H01J 37/32449 |
| 10,541,113 B2 * | | 1/2020 | Lubomirsky | H01J 37/321 |
| 10,600,639 B2 * | | 3/2020 | Ko | H01L 21/0223 |
| 10,629,473 B2 * | | 4/2020 | Ko | H01J 37/32091 |
| 10,640,865 B2 * | | 5/2020 | Lee | C23C 14/08 |
| 2002/0192394 A1 * | | 12/2002 | Ebe | C23C 16/24 427/569 |
| 2003/0010452 A1 * | | 1/2003 | Park | C23C 16/45589 156/345.33 |
| 2003/0019580 A1 * | | 1/2003 | Strang | C23C 16/45589 156/345.33 |
| 2003/0106643 A1 * | | 6/2003 | Tabuchi | C23C 16/24 156/345.35 |
| 2004/0050326 A1 * | | 3/2004 | Thilderkvist | C23C 16/45574 118/715 |
| 2004/0082251 A1 * | | 4/2004 | Bach | C23C 16/52 445/60 |
| 2005/0092249 A1 * | | 5/2005 | Kilpela | C23C 16/45514 118/715 |
| 2005/0145338 A1 * | | 7/2005 | Park | H01L 21/67017 156/345.34 |
| 2006/0000411 A1 * | | 1/2006 | Seo | C23C 16/45544 118/715 |
| 2009/0011595 A1 * | | 1/2009 | Seo | C23C 16/45565 438/680 |
| 2009/0214800 A1 * | | 8/2009 | Saito | C01B 32/162 427/577 |
| 2009/0246374 A1 * | | 10/2009 | Vukovic | C23C 16/45563 427/255.28 |
| 2010/0203246 A1 * | | 8/2010 | Yasui | H01L 21/0254 427/255.394 |
| 2010/0224482 A1 * | | 9/2010 | Yamaguchi | H01J 37/3464 204/192.15 |
| 2010/0243166 A1 * | | 9/2010 | Hayashi | H01J 37/32568 156/345.34 |
| 2011/0101245 A1 * | | 5/2011 | Hu | H01J 1/304 250/492.3 |
| 2011/0226181 A1 * | | 9/2011 | Yamamoto | H01L 21/76843 118/724 |
| 2012/0052216 A1 * | | 3/2012 | Hanawa | C23C 16/52 427/582 |
| 2012/0067971 A1 * | | 3/2012 | Byun | C23C 16/45591 239/106 |
| 2012/0070590 A1 * | | 3/2012 | Huang | C23C 16/45536 427/532 |
| 2012/0160173 A1 * | | 6/2012 | Endo | C23C 16/4412 118/728 |
| 2012/0305184 A1 * | | 12/2012 | Singh | H01J 37/32633 156/345.3 |
| 2013/0052804 A1 * | | 2/2013 | Song | C23C 16/45574 438/478 |
| 2013/0118405 A1 * | | 5/2013 | Ho | C23C 16/45572 118/715 |
| 2013/0174783 A1 * | | 7/2013 | Suzuki | C23C 16/45565 118/725 |
| 2013/0196454 A1 * | | 8/2013 | Inoue | H01L 22/20 438/5 |
| 2013/0298835 A1 * | | 11/2013 | Tam | C30B 25/14 118/728 |
| 2014/0027060 A1 * | | 1/2014 | Ranish | G01J 5/0818 156/345.33 |
| 2014/0227458 A1 * | | 8/2014 | Karakawa | H01J 37/32972 427/569 |
| 2015/0007771 A1 * | | 1/2015 | Silva | C23C 16/45565 118/715 |
| 2016/0122866 A1 * | | 5/2016 | Tung | C23C 14/24 427/561 |
| 2016/0172204 A1 * | | 6/2016 | Ni | H01J 37/32633 438/706 |
| 2017/0294333 A1 | | 10/2017 | Iu et al. | |
| 2018/0025928 A1 * | | 1/2018 | Chito | H01J 37/32009 156/345.28 |
| 2020/0255934 A1 * | | 8/2020 | Lee | C23C 14/541 |

* cited by examiner

DEPOSITION EQUIPMENT AND METHOD OF FABRICATING SEMICONDUCTOR DEVICE USING THE SAME

TECHNICAL FIELD

The present inventive concept relates to a deposition equipment and a method of fabricating a semiconductor device using the same.

DISCUSSION OF RELATED ART

In the process of fabricating a semiconductor device usually includes a deposition step for forming a thin film on a wafer. The deposition step may include a physical deposition step and/or a chemical deposition step, and may be carried out in a deposition equipment.

To deposit a uniform thin film on a wafer, the deposition equipment may include a wafer chuck that maintains the wafer in a stable state. The wafer chuck needs to fix the wafer to prevent movement or misalignment of the wafer during the deposition step.

There are various kinds of wafer chucks such as, for example, a mechanical chuck that directly holds the wafer on an outer peripheral surface of the wafer using a mechanical clamp, a vacuum chuck that holds the wafer on a back side of the wafer by vacuum, and an electrostatic chuck which holds the wafer with an electrostatic attraction force.

To ensure that the deposition step is stable and productive, any of these wafer chucks used is required to maintain clean to prevent wafer sliding and/or wafer contamination.

SUMMARY

Exemplary embodiments of the present inventive concept provide a deposition equipment with increased lifetime of the wafer chuck to enhance productivity and stability of the deposition step, and a method of fabricating of a semiconductor device using the deposition equipment, by preventing the surface of the wafer chuck from being contaminated in a state in which the wafer is not loaded on the wafer chuck.

According to an aspect of the present inventive concept, a deposition equipment includes: a reaction chamber including an upper plate and a container body, the upper plate including a gas supplier for injecting a processing gas; a wafer chuck including an upper surface on which a wafer is loaded, in the reaction chamber, with the upper surface of the wafer chuck facing the upper plate; and a processing gas shielding section which prevents the processing gas from being adsorbed to the upper surface of the wafer chuck and is disposed between the upper plate and the wafer chuck in a state in which the wafer is removed from the wafer chuck, in which the processing gas shielding section includes a shutter which is plate-like, the shutter includes a first region, a second region, and a third region between the first region and the second region, and the first region of the shutter includes a gas discharge section for jetting a purging gas toward the wafer chuck, and the third region of the shutter does not include a gas discharge section for jetting the purging gas toward the wafer chuck.

According to an aspect of the present inventive concept, a deposition equipment includes: a reaction chamber including an upper plate and a container body, the upper plate including a gas supplier for injecting a processing gas; a wafer chuck having an upper surface on which a wafer is loaded and including a plurality of gas holes formed on the upper surface, in the reaction chamber, with the upper surface of the wafer chuck facing the upper plate; a first gas line which supplies a first gas for preventing the processing gas from being adsorbed to the upper surface of the wafer chuck in a state in which the wafer is removed from the wafer chuck; and a second gas line which supplies a second gas for providing deposition step stability in a state in which the wafer is loaded on the wafer chuck, in which the first gas and the second gas are jetted to the upper surface of the wafer chuck by the plurality of gas holes.

According to an aspect of the present inventive concept, a deposition equipment includes: a reaction chamber including an upper plate and a container body, the upper plate including a gas supplier for injecting a processing gas; a wafer chuck including an upper surface on which a wafer is loaded, in the reaction chamber, with the upper surface of the wafer chuck facing the upper plate; and a processing gas shielding section which prevents the processing gas from being adsorbed to the upper surface of the wafer chuck and is disposed between the upper plate and the wafer chuck in a state in which the wafer is removed from the wafer chuck, in which the processing gas shielding section includes a gas nozzle which jets a purging gas onto the upper surface of the wafer chuck, and a portion of the gas nozzle for injecting the purging gas is disposed on a central section of the wafer chuck.

BRIEF DESCRIPTION OF THE DRAWINGS

The above and other aspects and features of the present inventive concept will become more apparent by describing in detail exemplary embodiments thereof with reference to the accompanying drawings, in which.

Figure 1:
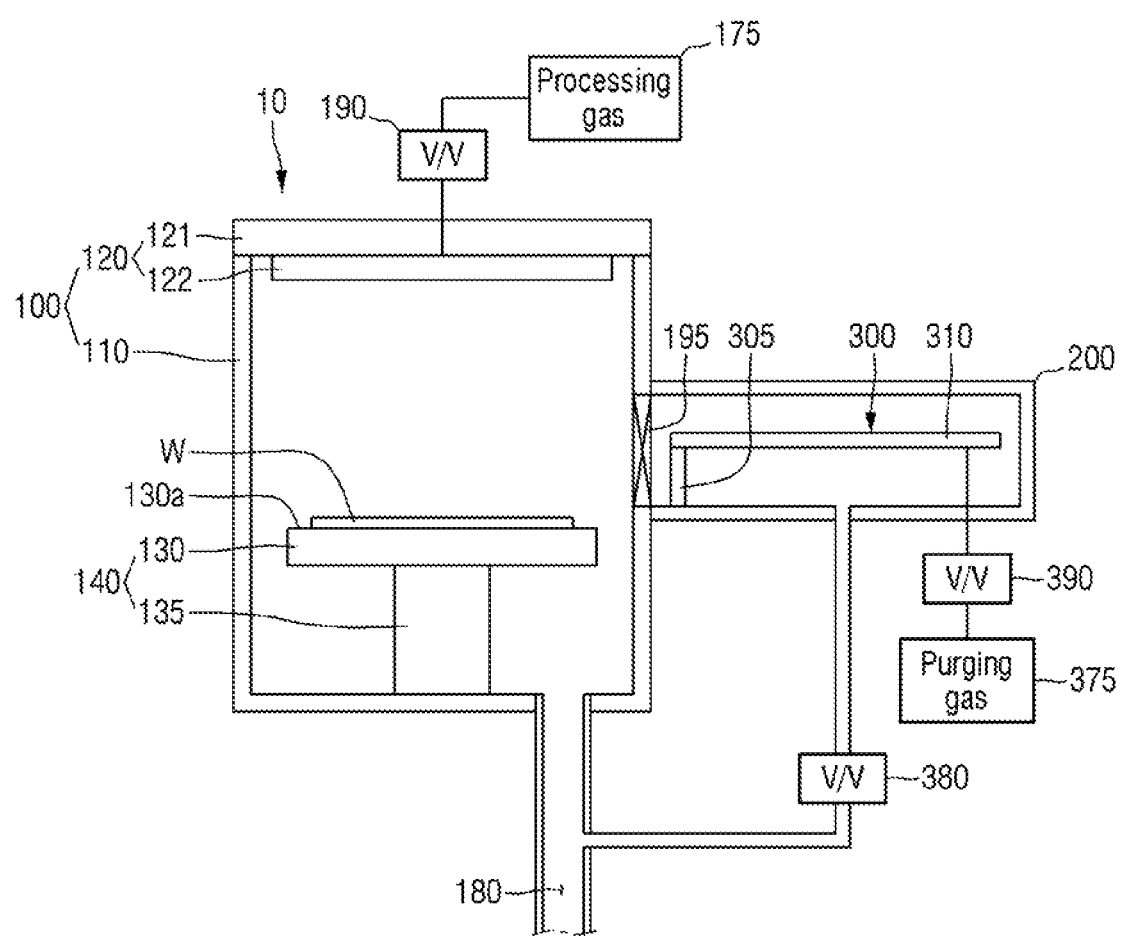
FIGS. 1 to 3B are diagrams for explaining a deposition equipment according to an exemplary embodiment of the present inventive concept.

Since the drawings in FIGS. 1-31 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIGS. 1 to 3B are diagrams for explaining a deposition equipment according to an exemplary embodiment of the present inventive concept.

Figure 2:
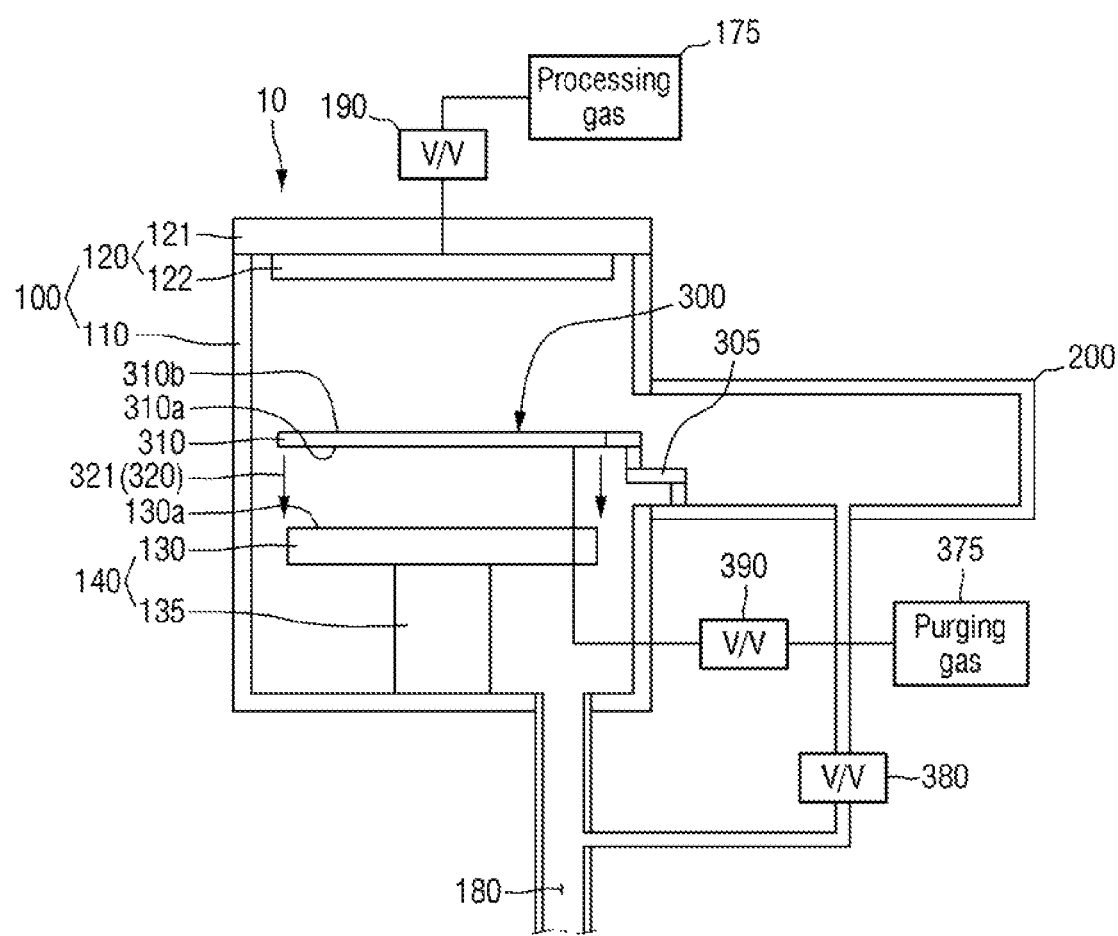
Figure 3A:
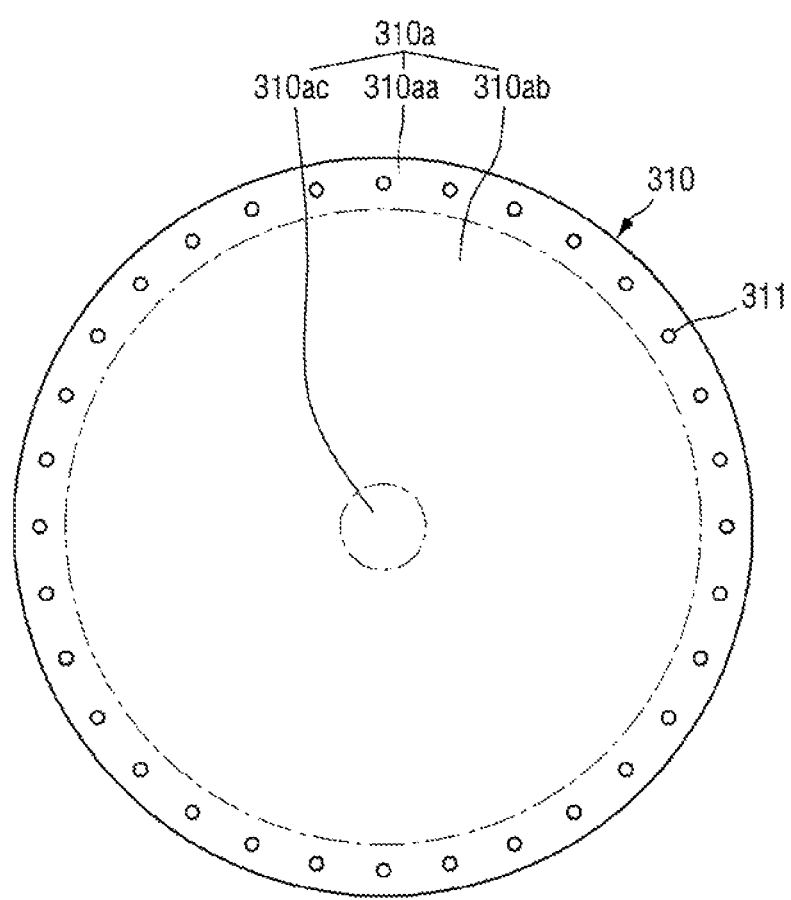
Figure 3B:
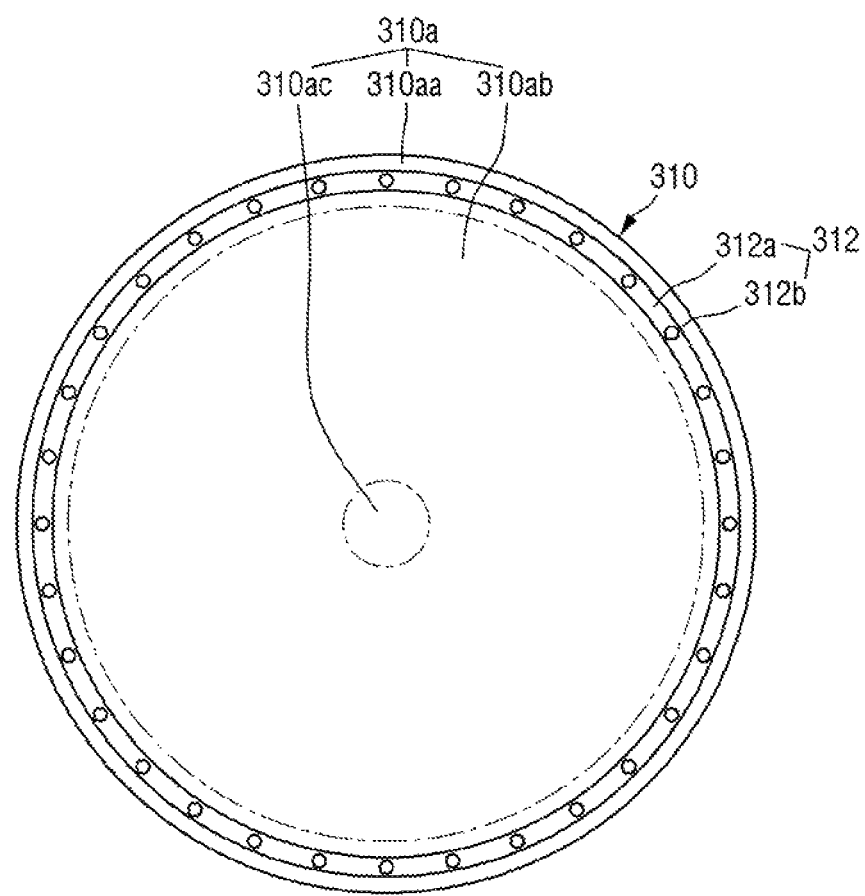

FIG. 1 is a schematic view for explaining the deposition equipment in a state in which a wafer is loaded. FIG. 2 is a schematic view for explaining the deposition equipment in a state in which the wafer is unloaded. FIGS. 3A and 3B are diagrams schematically illustrating one side of a shutter of FIGS. 1 and 2, respectively. For example, FIGS. 3A and 3B may illustrate a lower side of the shutter.

For reference, FIG. 1 is a diagram illustrating an active state of the deposition equipment in which a thin film is being formed on the wafer. FIG. 2 is a diagram illustrating a resting (idle or seasoning) state of the deposition equipment from which the wafer is removed.

Referring to FIGS. 1 to 3B, the deposition equipment according to an exemplary embodiment of the present inventive concept includes a reaction chamber 100, a storage chamber 200, a wafer chuck 130, and a processing gas shielding section 300.

The reaction chamber 100 may include a plate-like upper plate 120, and a cylindrical container body 110. The above described shapes of the upper plate 120 and the container body 110 are only for convenience of explanation, and the present inventive concept is not limited thereto.

The upper plate 120 and the container body 110 included in the reaction chamber 100 are configured to be separated from each other. The upper plate 120 may include a base plate 121 and a gas supplier 122. The gas supplier 122 may protrude from one side of the base plate 121, but the present inventive concept is not limited thereto. For example, the gas supplier 122 may be disposed on the side of the base plate 121 facing inner portion of the reaction chamber 100.

The upper plate 120 is attached to the container body 110 using, for example, an O-ring or the like, and the reaction chamber 100 may be sealed in a vacuum state accordingly. When separating the upper plate 120 from the container body 110, the upper plate 120 may be raised upward by a drive mechanism that may be disposed on the outer shell of the base plate 121.

The upper plate 120 and the container body 110 may be manufactured using, for example, a corrosion-resistant metal or the like. Since corrosive substances may exist in the reactive gas used for the thin film deposition step, the corrosion-resistant metal or the like may be used, but the present inventive concept is not limited thereto.

The gas supplier 122 may be connected to a processing gas supply unit 175, and may inject the processing gas provided from the processing gas supply unit 175 into the reaction chamber 100. The processing gas injected by the gas supplier 122 may be a source gas for depositing a thin film on the wafer W. For example, the gas supplier 122 may be a showerhead.

A processing gas valve 190 may be disposed between the gas supplier 122 and the processing gas supply unit 175 for adjusting provision of the processing gas to the gas supplier 122. For example, when the deposition equipment 10 is in an active state, the processing gas valve 190 may be opened, and when the deposition equipment 10 is in an idle state, the processing gas valve 190 may be closed.

In FIGS. 1 and 2, it is illustrated that there is only one processing gas supply unit 175 connected to the gas supplier 122, but this is only for convenience of explanation, and the present inventive concept is not limited thereto. For example, two or more gas supply units 175 or other kind of unit(s) may be connected to the gas supplier 122.

In the following description, the processing gas provided by the processing gas supply unit 175 is illustrated to include a precursor including a metal, but the present inventive concept is not limited thereto. The precursor including a metal may be used to deposit a thin film of the metal, or may be used to deposit a thin film of a compound including the metal. For example, the compound may be a metal oxide, a metal nitride or a metal silicide.

A wafer loading unit 140 may be disposed in the reaction chamber 100, and may include a wafer chuck 130, and a chuck support 135 for supporting the wafer chuck 130. For example, both the wafer chuck 130 and the chuck support 135 may be disposed within the reaction chamber 100.

The wafer W may be loaded onto the wafer chuck 130, for example, on the upper surface 130a of the wafer chuck. The upper surface 130a of the wafer chuck may face the gas supplier 122.

In the following description, the wafer chuck 130 is illustrated as an electrostatic chuck, but the present inventive concept is not limited thereto. For example, the wafer chuck 130 may be a mechanical chuck or a vacuum chuck.

The wafer W may be, for example, bulk silicon (Si) or silicon-on-insulator (SOI). Alternatively, the wafer W may be a silicon substrate or a substrate including other material such as, for example, silicon germanium (SiGe), indium antimonide (InSb), lead telluride (PbTe), indium arsenide (InAs), indium phosphide (InP), gallium arsenide (GaAs) or gallium antimonide (GaSb). Or, the wafer W may have an epitaxial layer formed on the base substrate.

In the deposition equipment according to an exemplary embodiment of the present inventive concept, a state in which the wafer W is loaded on the wafer chuck 130 is illustrated as an active state of the deposition equipment 10, and a state in which the wafer W is removed from the wafer chuck 130 is described as an idle state of the deposition equipment 10.

A pumping port 180 may be disposed, for example, in the lower part of the container body 110, and may discharge the processing gas provided from the gas supplier 122. That is, the processing gas which is not used for the thin film deposition may be discharged to the outside via the pumping port 180. Since the pumping port 180 is disposed in the lower part of the container body 110, the fluid in the reaction chamber 100 may flow from above (the gas supplier 122) to below (the lower part of the container body 110).

The pumping port 180 may be connected to a pump. Further, in FIGS. 1 and 2, one pumping port 180 is illustrated, but it is only for convenience of explanation, and the present inventive concept is not limited thereto.

The storage chamber 200 may be connected to the reaction chamber 100. A gate valve 195 may be disposed between the storage chamber 200 and the reaction chamber 100. For example, when the deposition equipment 10 is in an active state, the gate valve 195 is closed, and the storage chamber 200 and the reaction chamber 100 may be spatially separated from each other. When the deposition equipment 10 is in an idle state, the gate valve 195 is opened, and the storage chamber 200 may be spatially connected to the reaction chamber 100.

The pressure in the storage chamber 200 may be adjusted via opening and closing of a chamber pressure valve 380 which is disposed between the storage chamber 200 and the pumping port 180.

The processing gas shielding section 300 may include a shutter 310, and a robot arm 305 involved in movement of the shutter 310. The shutter 310 may have a plate-like shape. In FIGS. 3A and 3B, the shutter 310 is illustrated to have a circular shape in a plan view, but it is for convenience of explanation, and the present inventive concept is not limited thereto.

When the deposition equipment 10 is in the active state, the processing gas shielding section 300 may be stored in the storage chamber 200. That is, while the thin film is being deposited on the wafer W, the processing gas shielding section 300 may be stored in the storage chamber 200. In the idle state of the deposition equipment 10, the processing gas shielding section 300 may move into the reaction chamber 100.

The shutter 310 may include a first surface 310a and a second surface 310b which are disposed on opposite sides of the shutter 310. When the processing gas shielding section 300 moves into the reaction chamber 100, the first surface 310a of the shutter may face the upper surface 130a of the wafer chuck, and the second surface 310b of the shutter may face the gas supplier 122. For example, the processing gas shielding section 300 may prevent the processing gas from being adsorbed to the upper surface 130a of the wafer chuck to be described later, and may be disposed between the upper plate 120 and the wafer chuck 130 in a state in which the wafer W is removed from the wafer chuck 130.

A purging gas supply unit 375 may provide a purging gas to the processing gas shielding section 300. A purging gas valve 390 may be disposed between the purging gas supply unit 375 and the processing gas shielding section 300, and may adjust provision of the purging gas to the processing gas shielding section 300.

The purging gas provided by the purging gas supply unit 375 may be, for example, an inert gas. For example, the purging gas may include, but is not limited to: argon (Ar), nitrogen ($N_2$), and the like.

In the deposition equipment according to an exemplary embodiment of the present inventive concept, the purging gas supply unit 375 may be connected to the shutter 310 included in the processing gas shielding section 300. The purging gas supply unit 375 may provide the purging gas to the shutter 310.

The configuration in which the deposition equipment 10 according to an exemplary embodiment of the present inventive concept uses a gas supplier 122 for injecting the processing gas, and the deposition equipment 10 is a chemical vapor deposition equipment or an atomic layer deposition equipment as illustrated here, but the present inventive concept is not limited thereto. For example, the present inventive concept may, of course, be applied to the physical vapor deposition equipment or any other suitable deposition equipment.

With reference to FIGS. 2 to 3B, the processing gas shielding section 300 when the deposition equipment 10 is in then idle state will be described.

In the state in which the wafer W is removed from the wafer chuck 130, the processing gas shielding section 300 may prevent the processing gas from being adsorbed to the upper surface 130a of the wafer chuck. For example, the shutter 310 provided with purging gas may be moved to a place between the upper plate 120 and the wafer chuck 130 to prevent the processing gas from being adsorbed to the upper surface 130a of the wafer chuck. The state in which the wafer W is removed from the wafer chuck 130 may be a state in which the deposition equipment 10 is in the idle state.

When the deposition equipment 10 is in the idle state, the processing gas valve 190 may be closed. When the processing gas valve 190 is closed, the processing gas supply unit 175 may not provide the processing gas to the gas supplier 122. The processing gas is not supplied to the gas supplier 122 or the reaction chamber 100, but some of the processing gas may remain on the gas supplier 122 and/or the wall surface of the reaction chamber 100.

When the deposition equipment 10 is in the idle state, the fluid in the reaction chamber 100 may be discharged to the outside via the pumping port 180 for the stability of the deposition equipment 10. The fluid discharged to the outside via the pumping port 180 may also contain the reaction gas remaining on the gas supplier 122 and/or the wall surface of the reaction chamber 100. At this time, some of the remaining reaction gas may be adsorbed to the upper surface 130a of the wafer chuck, and thus a thin film may be deposited on the upper surface 130a of the wafer chuck.

If the reaction gas is a precursor containing metal, a thin metal film may be deposited on the upper surface 130a of the wafer chuck, and the wafer chuck 130 may be contaminated. If the wafer chuck 130 is an electrostatic chuck using the electrostatic attraction force, when the wafer W is loaded on the upper surface 130a of the wafer chuck, the thin metal film deposited on the upper surface 130a of the wafer chuck may reduce the electrostatic attraction force between the wafer chuck 130 and the wafer W.

When the electrostatic attraction force between the wafer chuck 130 and the wafer W is reduced, the wafer W may not be fixed to the wafer chuck 130 and may move. As a result, when the deposition equipment 10 is in the active state, the wafer W may be detached from the wafer chuck 130, and a desired thin film may not be deposited on the wafer W.

To alleviate the reduction of the electrostatic attraction force between the wafer chuck 130 and the wafer W, in a state in which the wafer W is removed from the wafer chuck 130, the processing gas shielding section 300 may prevent the processing gas from being adsorbed to the upper surface 130a of the wafer chuck.

In a state in which the wafer W is removed from the wafer chuck 130, the processing gas shielding section 300 moved into the reaction chamber 100 may be disposed between the wafer chuck 130 and the gas supplier 122.

The processing gas shielding section 300 may include a shutter 310 and a curtain section 320 positioned along the periphery of the shutter 310. The shutter 310 may be placed side by side with the upper surface 130a of the wafer chuck.

The curtain section 320 located along the periphery of the shutter 310 may be a first vertical curtain section 321. The first vertical curtain section 321 may be a gas curtain formed by the purging gas jetted from the shutter 310. The first vertical curtain section 321 may be located surrounding the edge or along the periphery of the wafer chuck 130.

The first surface 310$a$ of the shutter includes a central section 310$ac$, a peripheral section 310$aa$ including the edge of the shutter 310, and a band section 310$ab$ located between the central section 310$ac$ of the first surface of the shutter and the peripheral section 310$aa$ of the first surface of the shutter. A first region of the shutter 310 includes the peripheral section 310$aa$ of the first surface of the shutter, a third region of the shutter 310 includes the central section 310$ac$ of the first surface of the shutter, a second region of the shutter 310 may include the band section 310$ab$ of the first surface of the shutter. The second region of the shutter 310 may be interposed between the first region of the shutter 310 and the third region of the shutter 310.

The second region of the shutter 310 is defined along the periphery of the third region of the shutter 310, and the first region of the shutter 310 may be defined along the periphery of the second region of the shutter 310.

In the deposition equipment according to an exemplary embodiment of the present inventive concept, the first region of the shutter 310 including the peripheral section 310$aa$ of the first surface of the shutter may include the first shutter gas discharge sections 311 and 312. The first shutter gas discharge sections 311 and 312 may jet the purging gas toward the wafer chuck 130. In other words, the first vertical curtain section 321 may be formed by the purging gas jetted from the first shutter gas discharge sections 311 and 312.

The purging gas provided from the purging gas supply unit 375 may be jetted toward the wafer chuck 130 via the first shutter gas discharge sections 311 and 312 included in the first region of the shutter 310.

The third region of the shutter 310 including the central section 310$ac$ of the first surface of the shutter and the second region of the shutter 310 including the band section 310$ab$ of the first surface of the shutter may not include a shutter gas discharge section which jets the purging gas toward the wafer chuck 130. For example, the first region of the shutter 310 may include the first shutter gas discharge sections 311 and 312 for jetting the purging gas toward the wafer chuck 130, but the second and third regions of the shutter 310 may not include a shutter gas discharge section for jetting the purging gas toward the wafer chuck 130.

In FIGS. 3A and 3B, since the central section 310$ac$ of the first surface of the shutter and the band section 310$ab$ of the first surface of the shutter are only conceptually distinguished but may not be physically distinguished, the central section 310$ac$ of the first surface of the shutter and the band section 310$ab$ of the first surface of the shutter may be one region.

As an example, in FIG. 3A, the first shutter gas discharge section 311 may be a gas hole formed in the peripheral section 310$aa$ of the first surface of the shutter.

As another example, in FIG. 3B, the first shutter gas discharge section 312 may include a shutter gas line 312$a$ disposed along the peripheral section 310$aa$ of the first surface of the shutter, and a shutter gas line hole 312$b$ formed in the shutter gas line 312$a$.

In FIGS. 3A and 3B, the first shutter gas discharge sections 311 and 312 are illustrated as being formed in a line along the periphery of the shutter 310, but this is only for convenience of explanation, and the present inventive concept is not limited thereto. For example, the first shutter gas discharge sections 311 and 312 may be arranged in various ways other than a line along the periphery of the shutter 310 for jetting the purging gas toward the wafer chuck 130 to efficiently prevent the processing gas from being adsorbed to the upper surface 130$a$ of the wafer chuck.

In FIG. 2, since the first vertical curtain section 321 as the gas curtain is formed along the periphery of the wafer chuck 130, the processing gas may be prevented from entering a space between the shutter 310 and the wafer chuck 130. As a result, contamination of the upper surface 130$a$ of the wafer chuck due to the processing gas may be prevented. For example, since the processing gas is prevented from entering the space between the shutter 310 and the wafer chuck 130, a thin film such as a metal thin film may not be deposited on the upper surface 130$a$ of the wafer chuck, and the wafer chuck 130 may not be contaminated.

Figure 4:
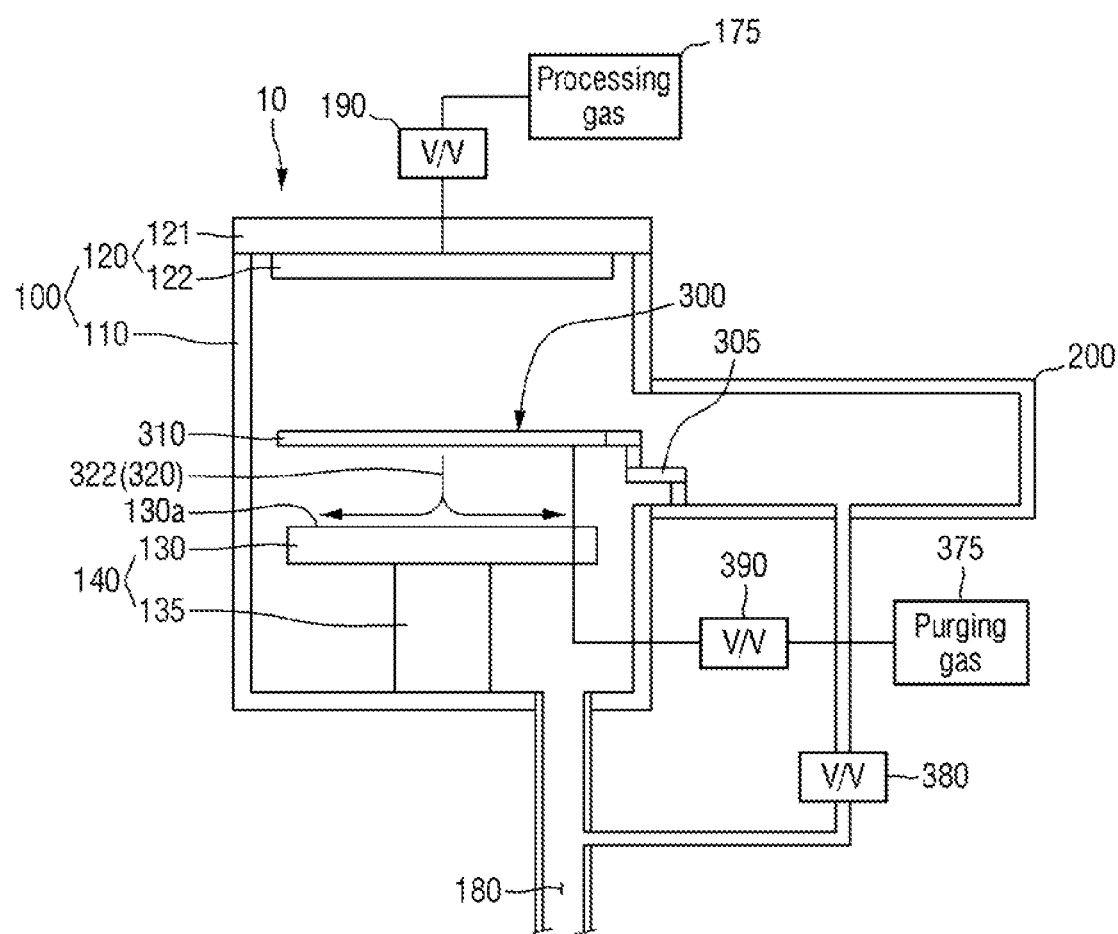
FIGS. 4 to 5D are diagrams for explaining the deposition equipment according to an exemplary embodiment of the present inventive concept.
Figure 5A:
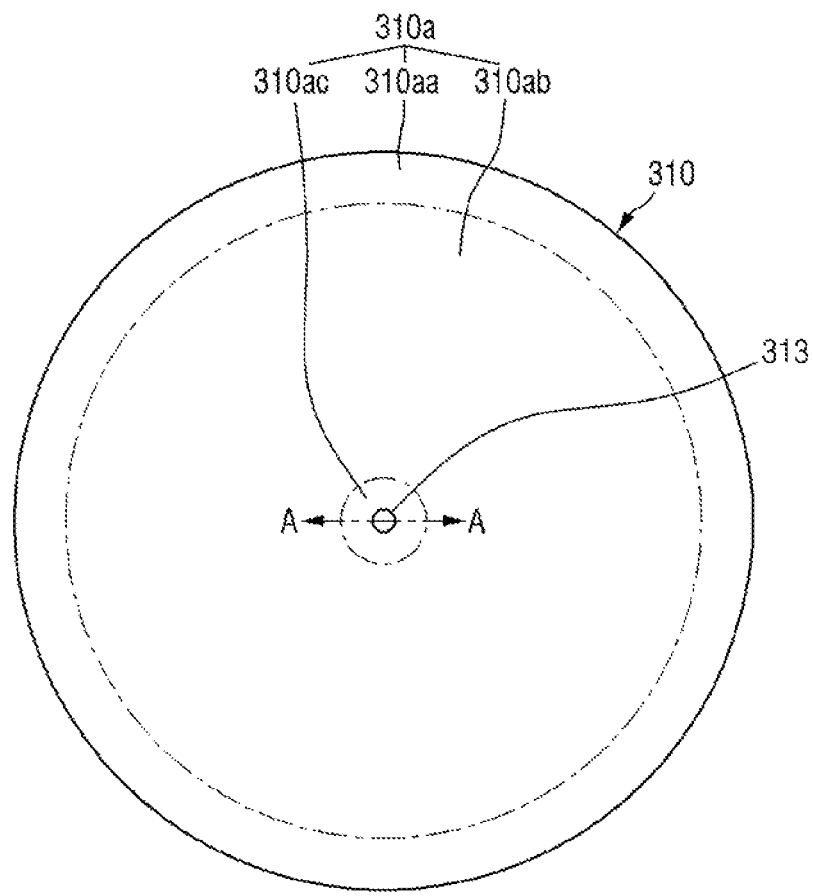
Figure 5B:
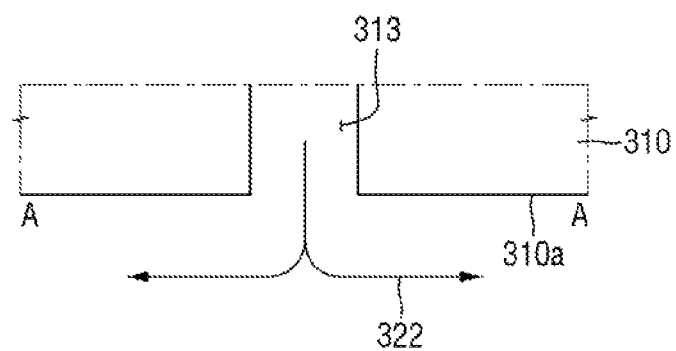
Figure 5C:
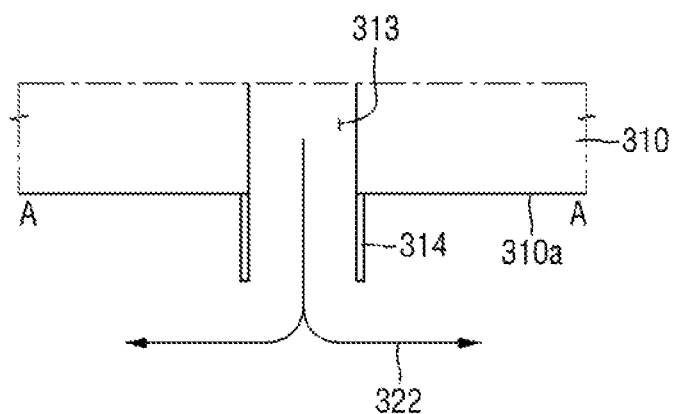
Figure 5D:
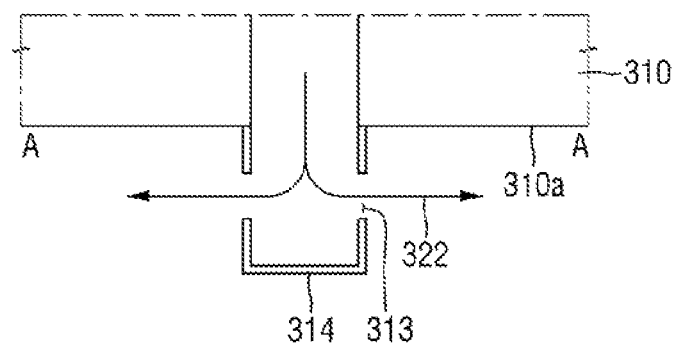

FIGS. 4 to 5D are diagrams for explaining the deposition equipment according to an exemplary embodiment of the present inventive concept. For the sake of convenience of explanation, differences from those described with reference to FIGS. 1 to 3B will be mainly described.

FIG. 4 is a schematic view for explaining the deposition equipment in a state in which the wafer is unloaded. FIG. 5A is a diagram schematically illustrating one side of the shutter of FIG. 4. FIGS. 5B to 5D are schematic cross-sectional diagrams taken along line A-A of FIG. 5A, respectively.

Referring to FIGS. 4 to 5D, in the deposition equipment according to an exemplary embodiment of the present inventive concept, the processing gas shielding section 300 may include a shutter 310, and a curtain section 320 formed by the purging gas jetted from the central section of the shutter 310.

The curtain section 320 formed by the purging gas jetted from the central section of the shutter 310 may be a horizontal curtain section 322. The horizontal curtain section 322 may be formed by jetting the purging gas onto the upper surface 130$a$ of the wafer chuck, and may be formed along the upper surface 130$a$ of the wafer chuck. The horizontal curtain section 322 may be a gas curtain.

In FIG. 5A, the third region of the shutter 310 including the central section 310$ac$ of the first surface of the shutter may include a second shutter gas discharge section 313. The second shutter gas discharge section 313 may jet the purging gas toward the wafer chuck 130. The purging gas provided from the purging gas supply unit 375 may be jetted toward the wafer chuck 130 via the second shutter gas discharge section 313. In other words, the horizontal curtain section 322 may be formed by the purging gas jetted from the second shutter gas discharge section 313.

The purging gas provided from the purging gas supply unit 375 may be jetted toward the wafer chuck 130 via the second shutter gas discharge section 313 included in the third region of the shutter 310, and may form the horizontal curtain section 322 included in the processing gas shielding section 300.

The first region of the shutter 310 including the peripheral section 310$aa$ of the first surface of the shutter, and the second region of the shutter including the band section 310$ab$ of the first surface of the shutter may not include a shutter gas discharge section which jets the purging gas toward the wafer chuck 130. For example, the third region of the shutter 310 may include the second shutter gas discharge section 313 for jetting the purging gas toward the wafer chuck 130, and the first and second regions of the shutter 310 may not include a shutter gas discharge section for jetting the purging gas toward the wafer chuck 130.

In FIG. 5A, since the peripheral section 310$aa$ of the first surface of the shutter and the band section 310$ab$ of the first surface of the shutter are only conceptually distinguished but may not be physically distinguished, the peripheral section 310*aa* of the first surface of the shutter and the band section 310*ab* of the first surface of the shutter may be one region.

As an example, in FIG. 5B, the second shutter gas discharge section 313 may be a gas hole formed in the central section 310*ac* of the first surface of the shutter.

As another example, in FIGS. 5C and 5D, the third region of the shutter 310 including the central section 310*ac* of the first surface of the shutter may include a shutter protrusion nozzle 314 which protrudes toward the wafer chuck 130.

The shutter protrusion nozzle 314 may protrude from the first surface 310*a* of the shutter. The shutter protrusion nozzle 314 is connected to the shutter 310, and may be disposed on the central section of the wafer chuck 130. In the shutter protrusion nozzle 314, the portion which jets the purging gas may be arranged on the central section of the wafer chuck 130. The portion which jets the purging gas may be a distal end of the shutter protrusion nozzle 314.

As an example, in FIG. 5C, the second shutter gas discharge section 313 may be formed at the distal end portion of the shutter protrusion nozzle 314. That is, the second shutter gas discharge section 313 may face the upper surface 130*a* of the wafer chuck. For example, the purging gas having passed through the second shutter gas discharge section 313 may be jetted in a direction perpendicular to the upper surface 130*a* of the wafer chuck.

As another example, in FIG. 5D, the second shutter gas discharge section 313 may be formed on the side wall portion of the shutter protrusion nozzle 314. That is, the second shutter gas discharge section 313 does not face the upper surface 130*a* of the wafer chuck. For example, the purging gas having passed through the second shutter gas discharge section 313 may be jetted in a direction parallel to the upper surface 130*a* of the wafer chuck.

Since the horizontal curtain section 322 as the gas curtain is formed along the upper surface 130*a* of the wafer chuck in FIG. 4, the processing gas entering the space between the shutter 310 and the wafer chuck 130 may be prevented from being adsorbed to the upper surface 130*a* of the wafer chuck. As a result, the upper surface 130*a* of the wafer chuck may be prevented from being contaminated with the processing gas. For example, the processing gas may not be absorbed to the upper surface 130*a* of the wafer chuck, a thin film such as a metal thin film may not be deposited on the upper surface 130*a* of the wafer chuck, and the wafer chuck 130 may not be contaminated.

Figure 6:
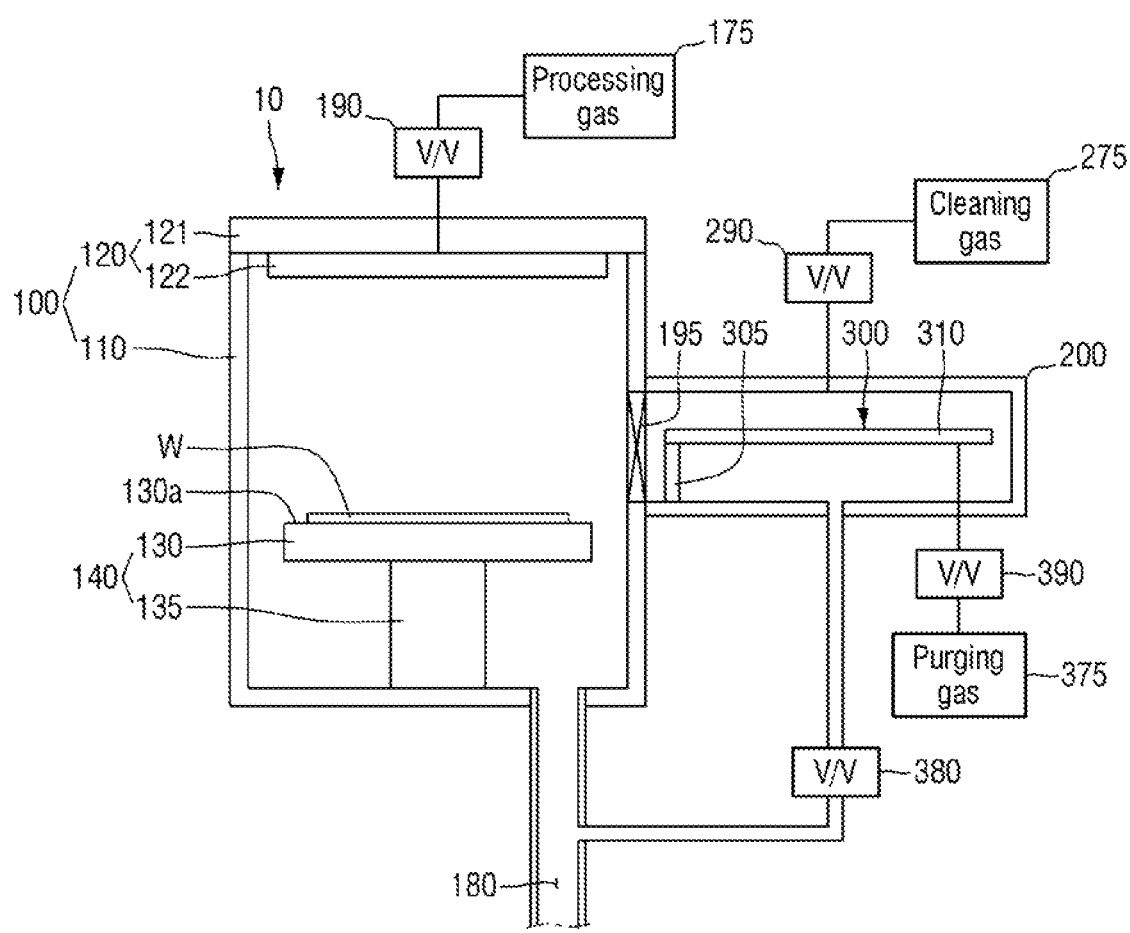
FIG. 6 is a diagram for explaining the deposition equipment according to an exemplary embodiment of the present inventive concept.

FIG. 6 is a diagram for explaining the deposition equipment according to an exemplary embodiment of the present inventive concept. For the sake of convenience of explanation, differences from those described with reference to FIGS. 1 to 5D will be mainly described.

For reference, FIG. 6 is a schematic view for explaining the deposition equipment in a state in which a wafer is loaded. In this case, the processing gas shielding section 300 is located inside the storage chamber 200. For example, the shutter 310 may be located inside the storage chamber 200 in the state in which the wafer W is loaded.

Referring to FIG. 6, in the deposition equipment according to an exemplary embodiment of the present inventive concept, the processing gas shielding section 300 may be cleaned inside the storage chamber 200. For example, the shutter 310 may be cleaned inside the storage chamber 200.

The cleaning gas supply unit 275 may provide the cleaning gas to the storage chamber 200. Cleaning of the processing gas shielding section 300 may be performed in an active state of the deposition equipment 10. A cleaning gas valve 290 may be disposed between the cleaning gas supply unit 275 and the storage chamber 200. The cleaning gas provided to the storage chamber 200 may be adjusted by opening and closing of the cleaning gas valve 290.

Figure 7:
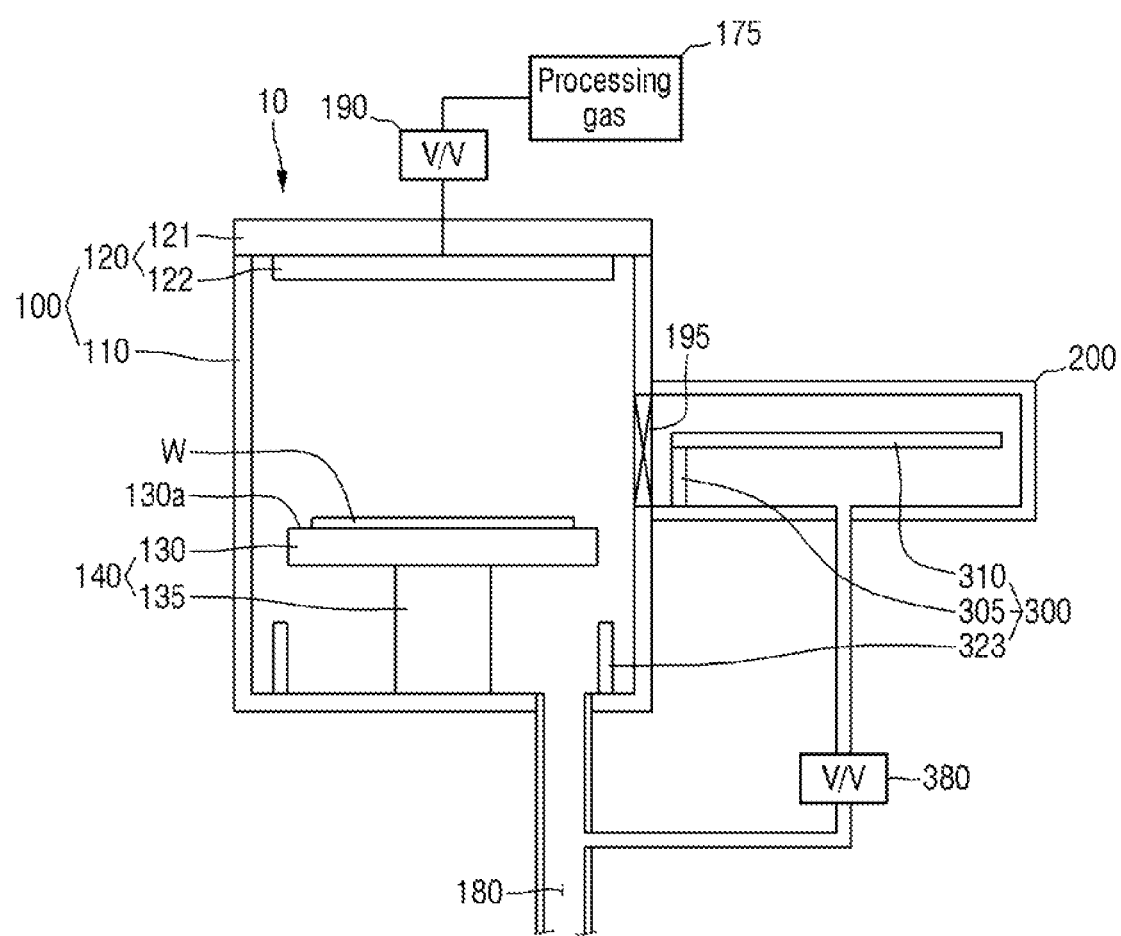
FIGS. 7 and 8 are diagrams for explaining the deposition equipment according to an exemplary embodiment of the present inventive concept.
Figure 8:
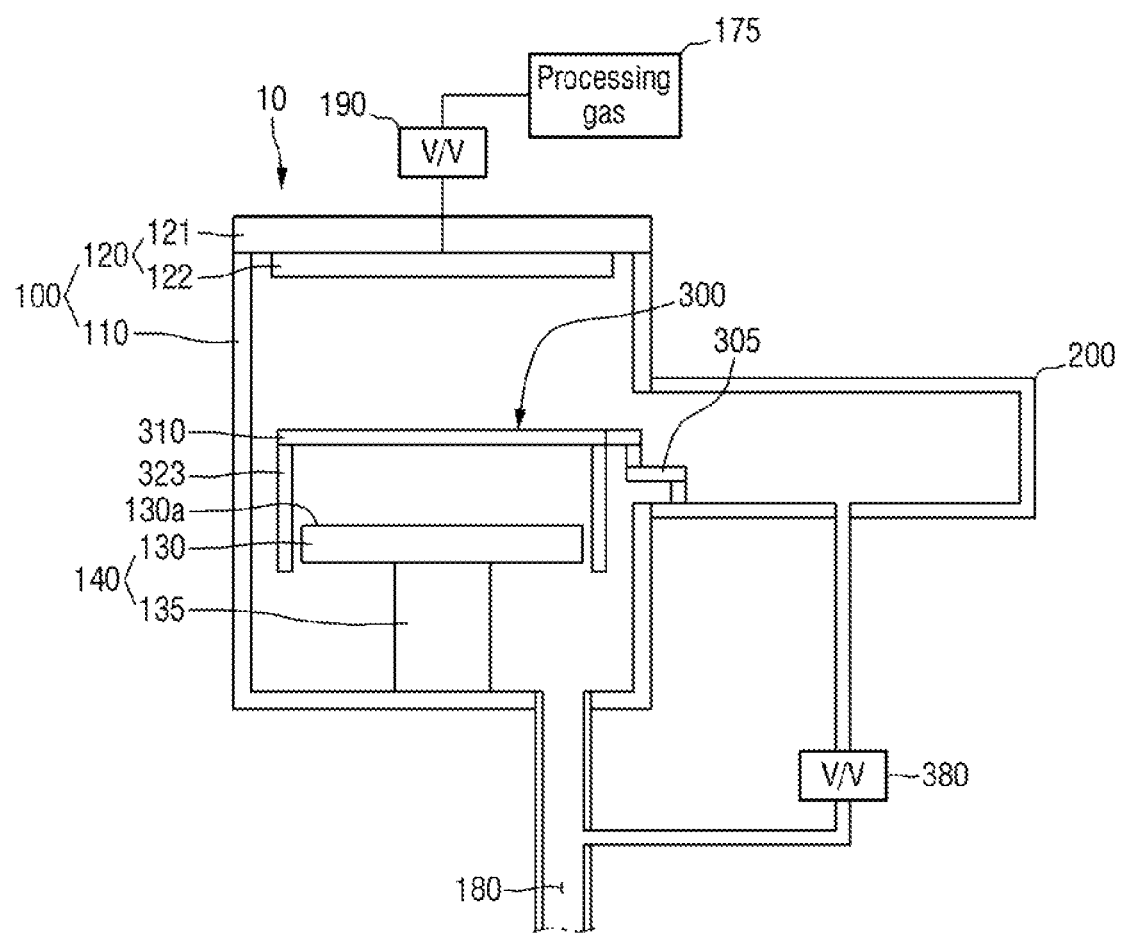

FIGS. 7 and 8 are diagrams for explaining the deposition equipment according to an exemplary embodiment of the present inventive concept. For the sake of convenience of explanation, differences from those described with reference to FIGS. 1 to 5I) will be mainly described.

For reference, FIG. 7 is a schematic view for explaining the deposition equipment in a state in which a wafer is loaded. FIG. 8 is a schematic view for explaining the deposition equipment in a state in which a wafer is unloaded.

Referring to FIGS. 7 and 8, in the deposition equipment according to an exemplary embodiment of the present inventive concept, the processing gas shielding section 300 may include a shutter 310 and a second vertical curtain section 323.

In the active state of the deposition equipment 10, the shutter 310 may be spaced apart from the second vertical curtain section 323. For example, the shutter 310 may be disposed in the storage chamber 200, and the second vertical curtain section 323 may be disposed in the reaction chamber 100.

The second vertical curtain section 323 may be a rigid body, and may be disposed along the periphery of the wafer loading unit 140 in the reaction chamber 100. The second vertical curtain section 323 may be disposed along the periphery of the wafer chuck 130.

In the active state of the deposition equipment 10, the second vertical curtain section 323 may be located below the upper surface 130*a* of the wafer chuck.

In the idle state of the deposition equipment 10, the second vertical curtain section 323 may rise in the direction of the upper surface 130*a* of the wafer chuck. The raised second vertical curtain section 323 may meet the shutter 310 moved into the reaction chamber 100 from the storage chamber 200.

The second vertical curtain section 323 may be located along the periphery of the shutter 310 in the idle state of the deposition equipment 10. The raised second vertical curtain section 323 may be disposed along the periphery of the wafer chuck 130.

The second vertical curtain section 323 may prevent the processing gas from entering the space between the shutter 310 and the wafer chuck 130.

In FIGS. 7 and 8, although the purging gas supply unit connected to the shutter 310 is not illustrated, the present inventive concept is not limited thereto. For example, in the deposition equipment according to an exemplary embodiment of the present inventive concept, in addition to the second vertical curtain section 323 provided to prevent the processing gas from entering the space between the shutter 310 and the wafer chuck 130 as shown in FIGS. 7 and 8, the purging gas supply unit 375 may be connected to the shutter 310 to provide the purging gas to the shutter 310 for preventing the processing gas from entering the space between the shutter 310 and the wafer chuck 130.

Figure 9:
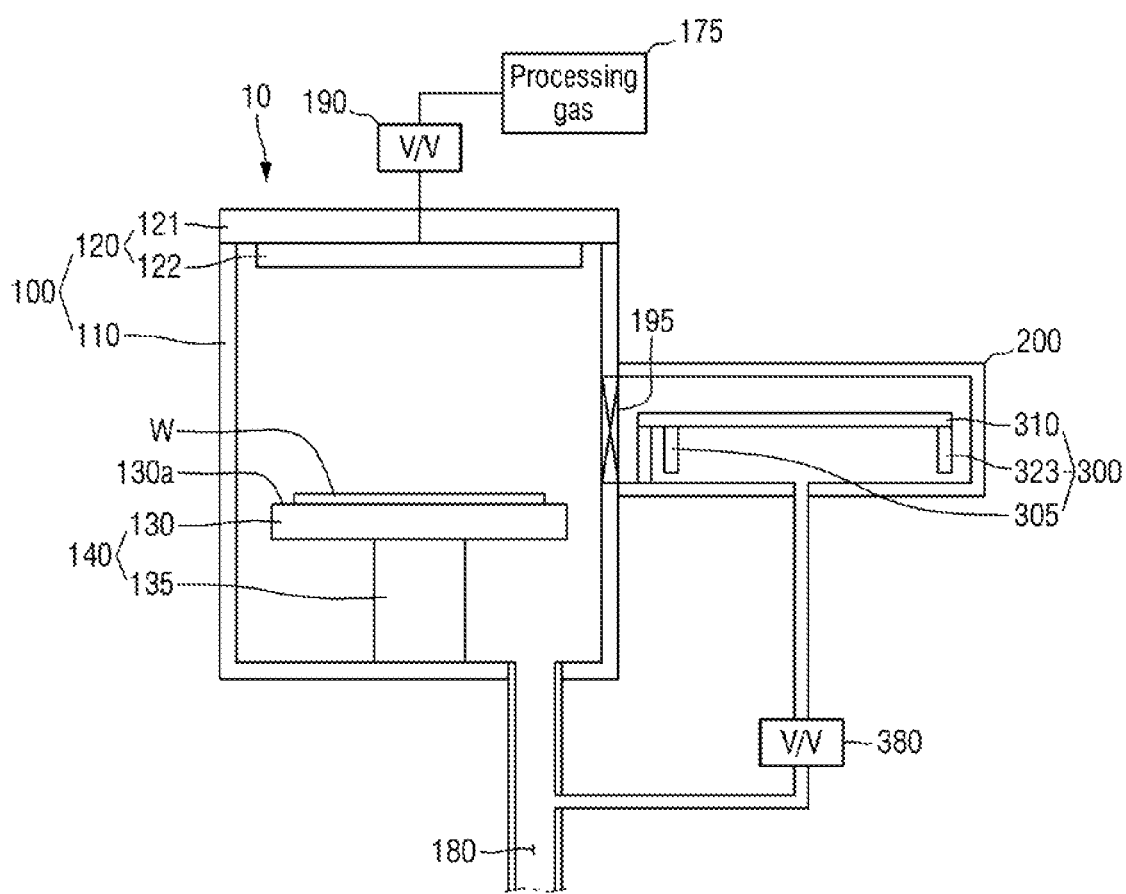
FIG. 9 is a diagram for explaining the deposition equipment according to an exemplary embodiment of the present inventive concept.

FIG. 9 is a diagram for explaining the deposition equipment according to an exemplary embodiment of the present inventive concept. For the sake of convenience of explanation, differences from those described with reference to FIGS. 7 and 8 will be mainly described.

For reference, FIG. 9 is a schematic view for explaining the deposition equipment in a state in which a wafer is loaded.

Referring to FIG. 9, in the deposition equipment according to an exemplary embodiment of the present inventive concept, the second vertical curtain section 323 may be fixed to the shutter 310.

In the active state of the deposition equipment 10, the processing gas shielding section 300 including the second vertical curtain section 323 and the shutter 310 may be located inside the storage chamber 200.

When the deposition equipment 10 is in the idle state, the second vertical curtain section 323 and the shutter 310 fixed to each other are moved into the reaction chamber 100, and may cover the wafer chuck 130 from which the wafer W is removed.

Figure 10:
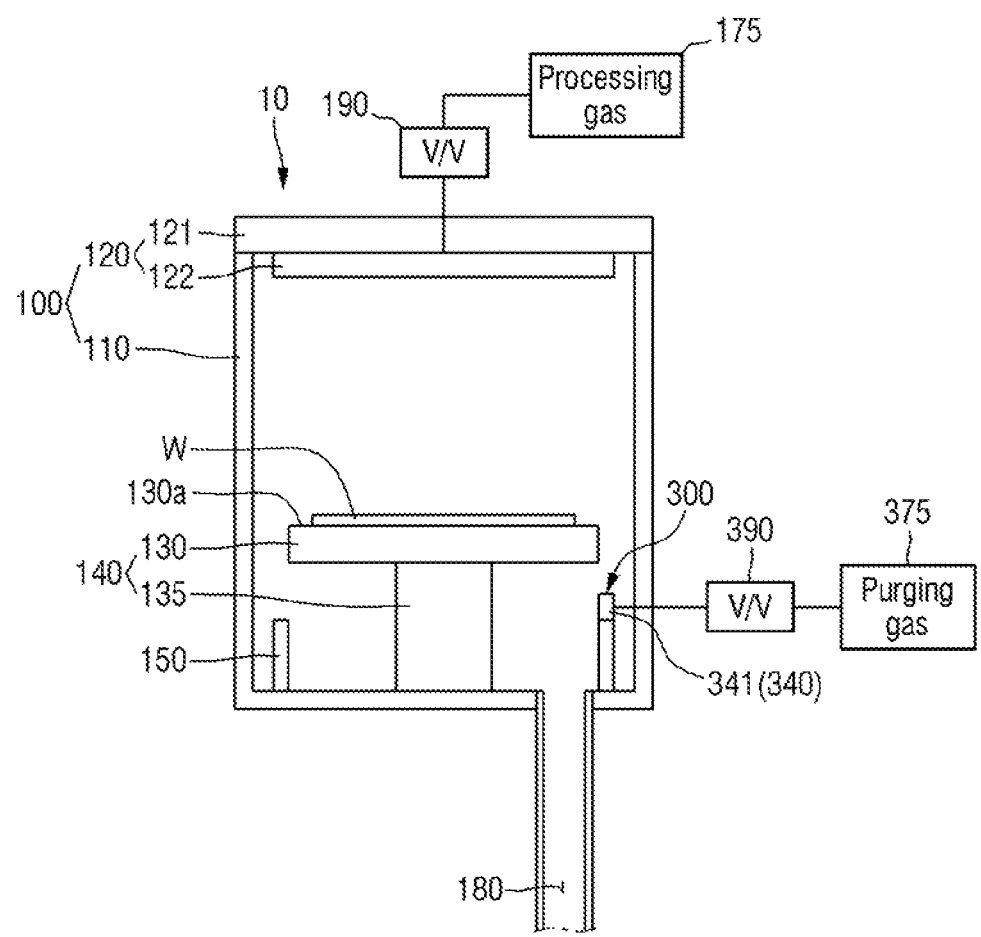
FIGS. 10 to 11B are diagrams for explaining the deposition equipment according to an exemplary embodiment of the present inventive concept.
Figure 11A:
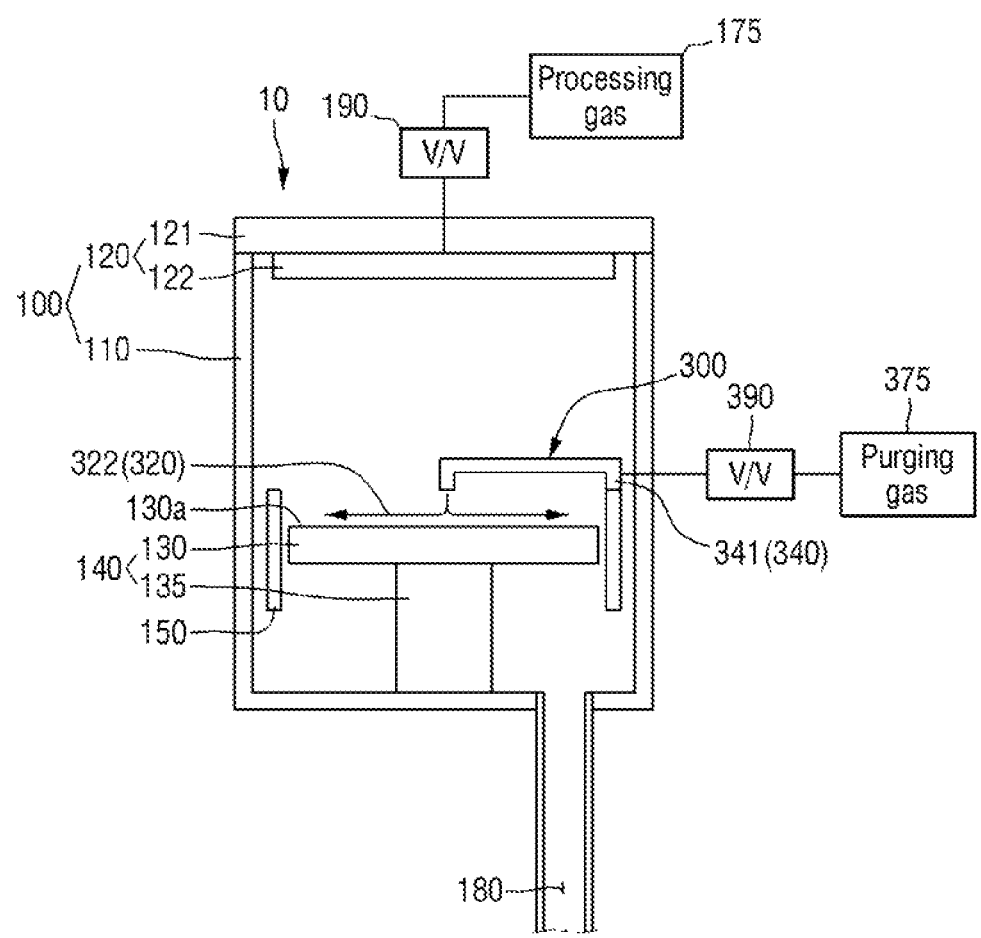
Figure 11B:
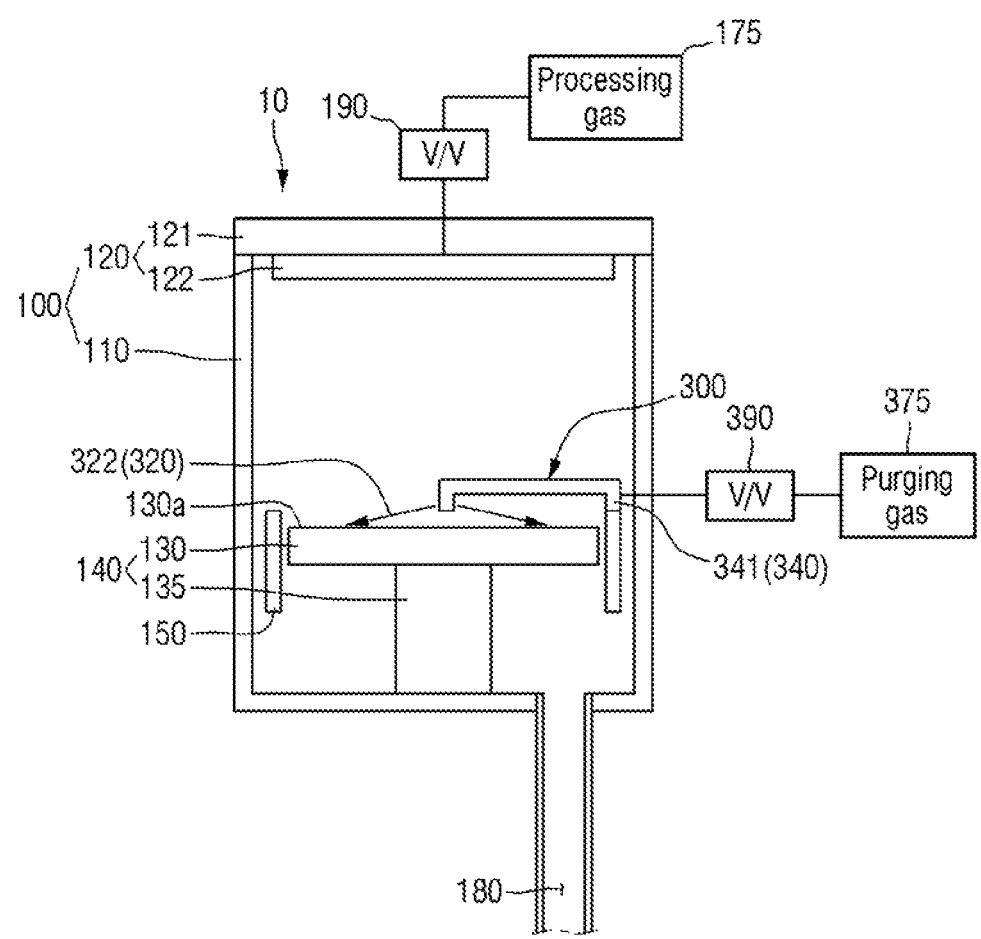

FIGS. 10 to 11B are diagrams for explaining the deposition equipment according to an exemplary embodiment of the present inventive concept. For the sake of convenience of explanation, differences from those described with reference to FIGS. 1 to 5D will be mainly described.

For reference, FIG. 10 is a schematic view for explaining the deposition equipment in a state in which the wafer is loaded. FIGS. 11A and 11B are schematic views for explaining the deposition equipment in a state in which the wafer is unloaded.

Referring to FIGS. 10 to 11B, in the deposition equipment according to an exemplary embodiment of the present inventive concept, the processing gas shielding section 300 may include at least one or more purging gas nozzles 340. The purging gas nozzle 340 may be connected to a purging gas supply unit 375 that provides the purging gas. A purging gas valve 390 may be disposed between the purging gas supply unit 375 and the processing gas shielding section 300, and may adjust provision of the purging gas to the purging gas nozzle 340.

When the deposition equipment 10 is in the active state which is a state in which the wafer W is loaded on the wafer chuck 130, the purging gas nozzle 340 may be located below the upper surface 130a of the wafer chuck. On the other hand, when the deposition equipment 10 is in the idle state which is a state in which the wafer W is removed from the wafer chuck 130, the purging gas nozzle 340 may be located above the upper surface 130a of the wafer chuck. Although the entire purging gas nozzle 340 may be located above the upper surface 130a of the wafer chuck, at least a portion which jets the purging gas may be located above the upper surface 130a of the wafer chuck. That is, the processing gas shielding section 300 including the purging gas nozzle 340 is disposed in the reaction chamber 100 no matter whether the deposition equipment 10 is in the active state or in the idle state.

In the idle state of the deposition equipment 10, the processing gas shielding section 300 may jet the purging gas to the upper surface 130a of the wafer chuck. For example, the purging gas nozzle 340 may jet the purging gas to the upper surface 130a of the wafer chuck.

The purging gas jetted onto the upper surface 130a of the wafer chuck may form the curtain section 320 of the processing gas shielding section 300. For example, the purging gas jetted onto the upper surface 130a of the wafer chuck may form the horizontal curtain section 322.

The purging gas nozzle 340 may be a central purging nozzle 341. The purging gas jetted from the central purging nozzle 341 may form the curtain section 320 of the processing gas shielding section 300.

In the idle state of the deposition equipment 10, the portion which jets the purging gas from the central purging nozzle 341 may be located on the central section of the wafer chuck 130. The portion which jets the purging gas may be the distal end of the central purging nozzle 341.

The horizontal curtain section 322 formed by the purging gas jetted from the central purging nozzle 341 may be a flow of gas flowing from the center to the periphery of the wafer chuck 130 as a gas curtain.

The central purging nozzle 341 may be connected to the lower structure 150. The lower structure 150 may be disposed along the periphery of the wafer chuck 130. In the active state of the deposition equipment 10, the lower structure 150 may be located below the wafer chuck 130. In the idle state of the deposition equipment 10, the lower structure 150 may rise so that the distal end of the central purging nozzle 341 is placed on the central section of the wafer chuck 130.

In the idle state of the deposition equipment 10, the central purging nozzle 341 connected to the lower structure 150 rotates, and the distal end of the central purging nozzle 341 may move onto the central section of the wafer chuck 130. Alternatively, in the idle state of the deposition equipment 10, a length of the central purging nozzle 341 connected to the lower structure 150 increases, and the distal end of the central purging nozzle 341 may move onto the central section of the wafer chuck 130.

As an example, in FIG. 11A, the purging gas jetted from the central purging nozzle 341 may be jetted in a direction perpendicular to the upper surface 130a of the wafer chuck.

As another example, in FIG. 11B, the purging gas jetted from the central purging nozzle 341 may be jetted in a direction parallel to the upper surface 130a of the wafer chuck.

As shown in FIGS. 11A and 11B, in the idle state of the deposition equipment 10, the central purging nozzle 341 and the horizontal curtain section 322 included in the processing gas shielding section 300 may be disposed between the upper plate 120 and the wafer chuck 130, and the horizontal curtain section 322 may prevent the processing gas from being adsorbed to the upper surface 130a of the wafer chuck.

Figure 12:
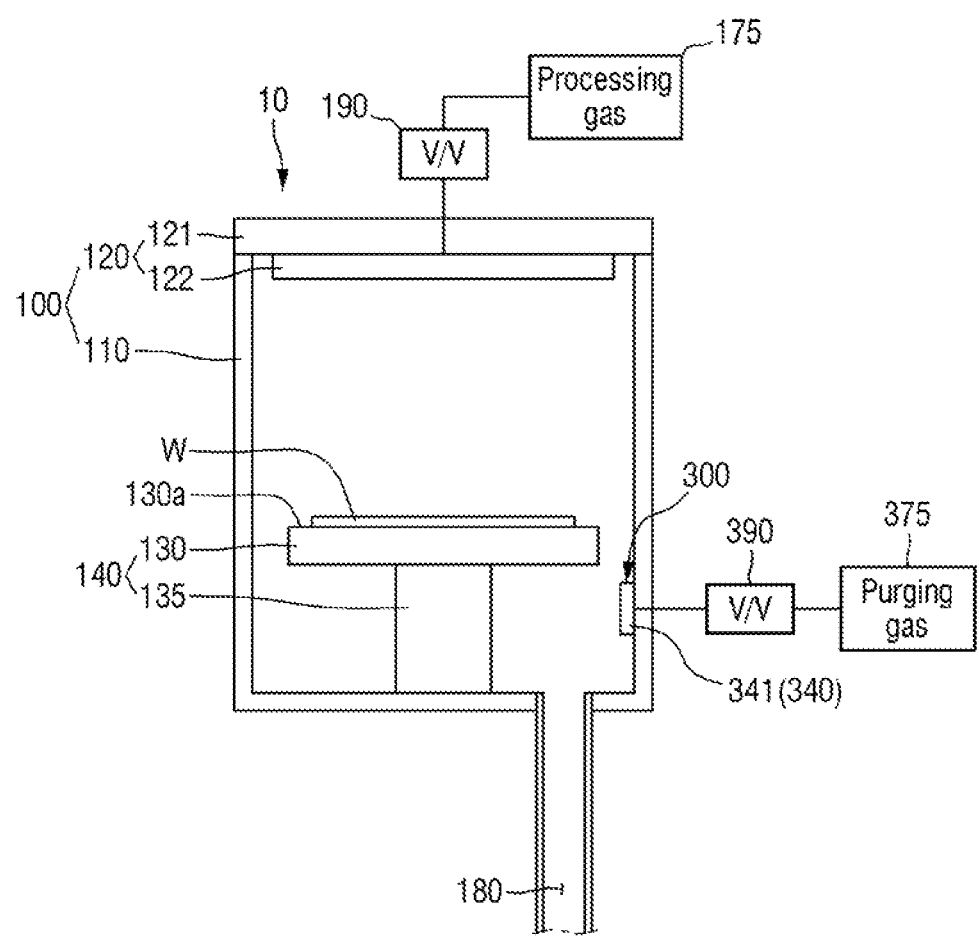
FIGS. 12 and 13 are diagrams for explaining the deposition equipment according to an exemplary embodiment of the present inventive concept.
Figure 13:
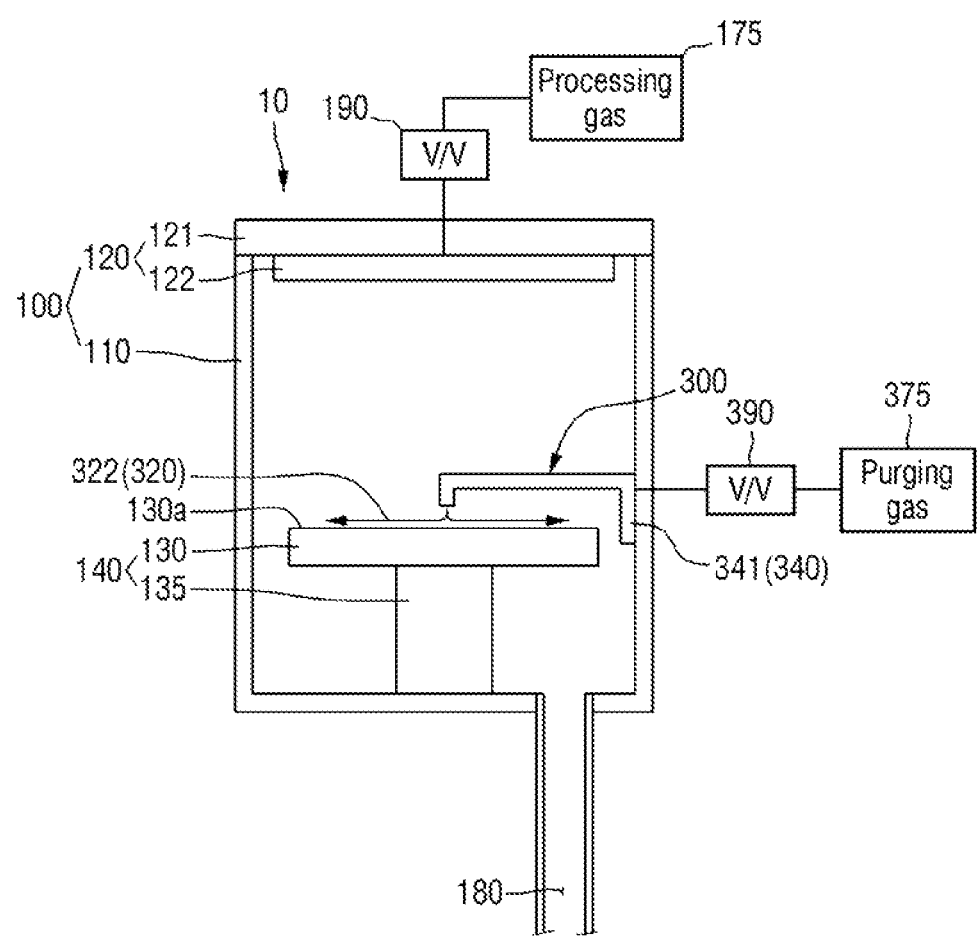

FIGS. 12 and 13 are diagrams for explaining the deposition equipment according to an exemplary embodiment of the present inventive concept. For the sake of convenience of explanation, differences from those described with reference to FIGS. 10 to 11B will be mainly described.

For reference, FIG. 12 is a schematic view for explaining the deposition equipment in a state in which a wafer is loaded. FIG. 13 is a schematic view for explaining the deposition equipment in a state in which the wafer is unloaded.

Referring to FIGS. 12 and 13, in the deposition equipment according to an exemplary embodiment of the present inventive concept, the central purging nozzle 341 may be connected to the side wall of the reaction chamber 100.

The central purging nozzle 341 connected to the side wall of the reaction chamber 100 may move up and down along the side wall of the reaction chamber 100.

As shown in FIG. 13, in the idle state of the deposition equipment 10, major portion of the central purging nozzle 341 and the horizontal curtain section 322 included in the processing gas shielding section 300 may be disposed between the upper plate 120 and the wafer chuck 130, and the horizontal curtain section 322 may prevent the processing gas from being adsorbed to the upper surface 130a of the wafer chuck.

FIGS. 14 to 16B are diagrams for explaining the deposition equipment according to an exemplary embodiment of the present inventive concept. For the sake of convenience of explanation, differences from those described with reference to FIGS. 10 to 11B will be mainly described.

Figure 14:
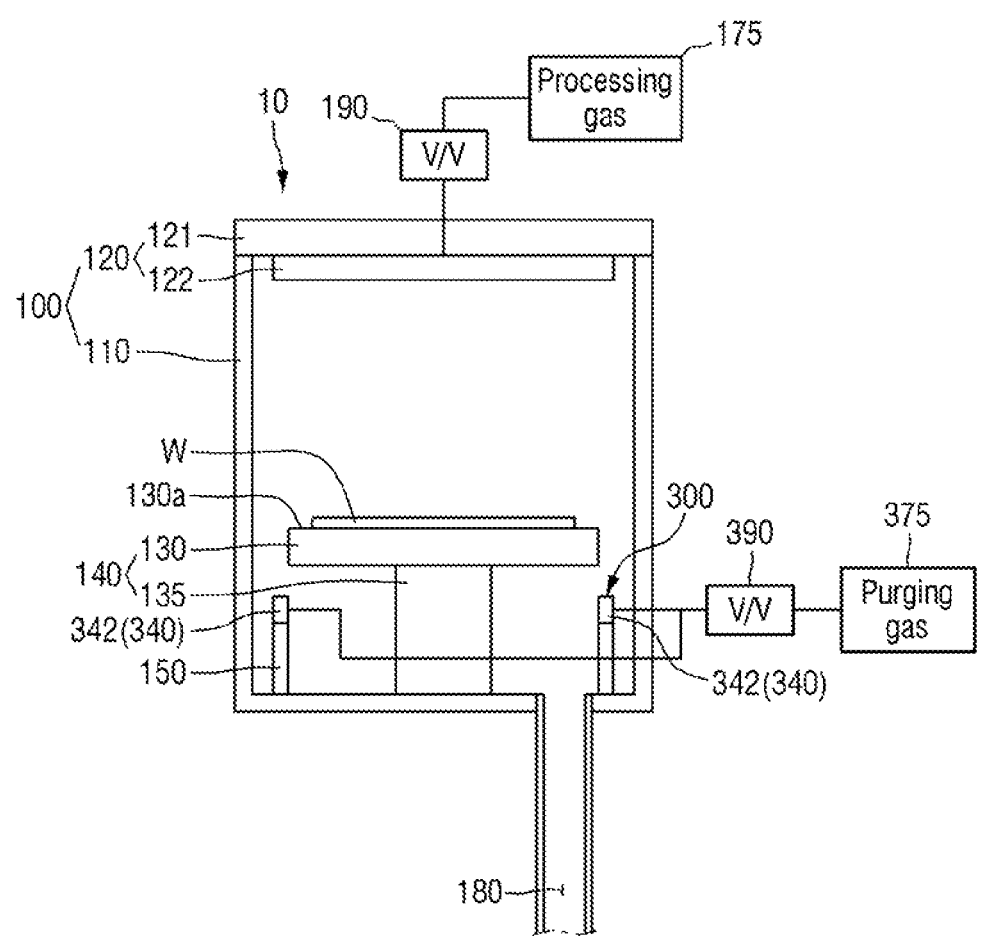
FIGS. 14 to 16B are diagrams for explaining the deposition equipment according to an exemplary embodiment of the present inventive concept.
Figure 15:
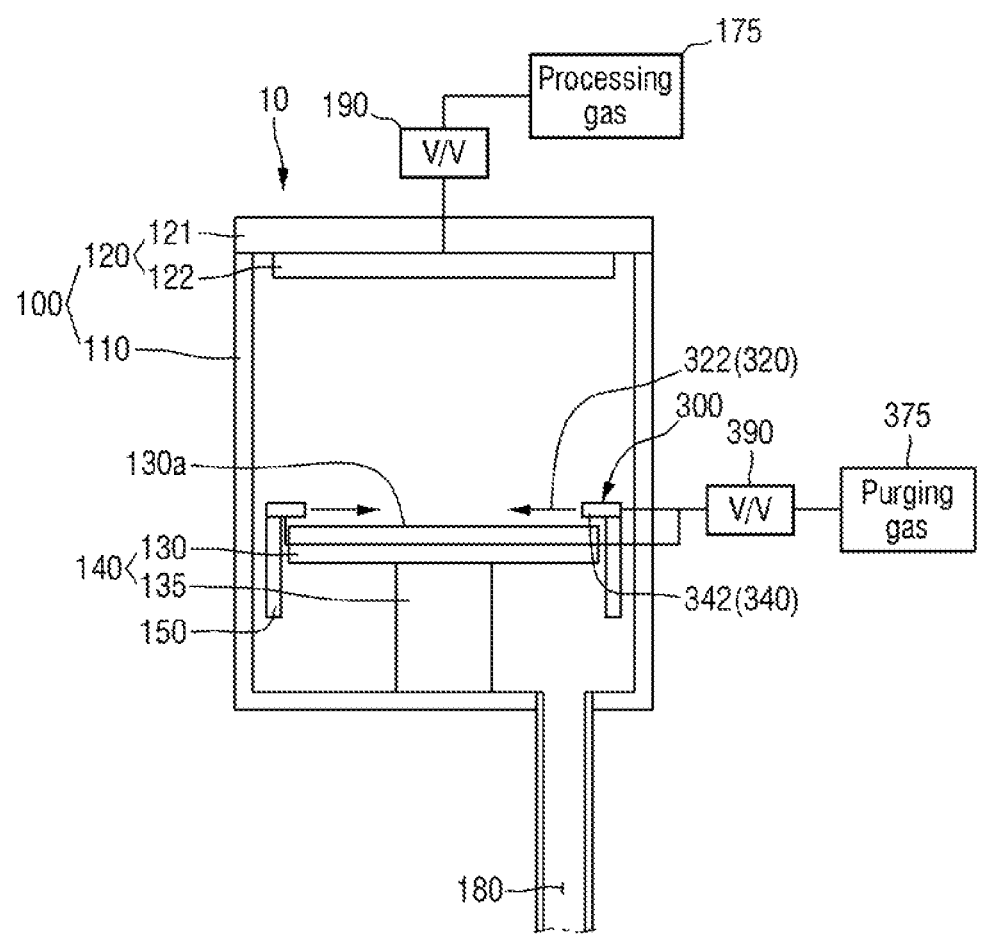
Figure 16A:
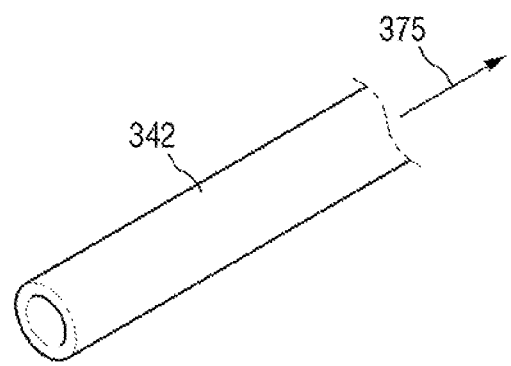
Figure 16B:
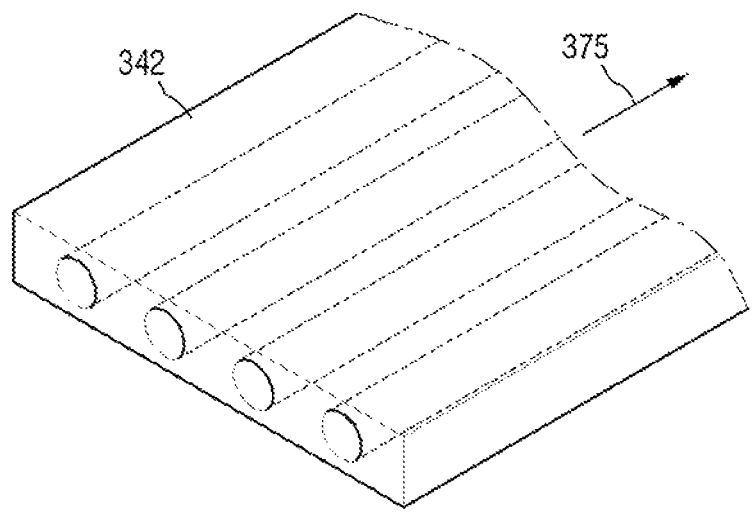

For reference, FIG. 14 is a schematic view for explaining the deposition equipment in a state in which the wafer is loaded. FIG. 15 is a schematic view for explaining the deposition equipment in a state in which the wafer is unloaded. FIGS. 16A and 16B are exemplary diagrams of the peripheral purging nozzle.

Referring to FIGS. 14 to 16B, in the deposition equipment according to an exemplary embodiment of the present inventive concept, the purging gas nozzle 340 may be a peripheral purging nozzle 342.

The purging gas jetted from the peripheral purging nozzle 342 may form the curtain section 320 of the processing gas shielding section. The purging gas jetted from the peripheral purging nozzle 342 may form a horizontal curtain section 322.

In the idle state of the deposition equipment 10, the portion which jets the purging gas from the peripheral purging nozzle 342 may be located around the wafer chuck 130. The portion which jets the purging gas may be the distal end of the peripheral purging nozzle 342.

The horizontal curtain section 322 formed by the purging gas jetted from the peripheral purging nozzle 342 may be a flow of gas flowing from the vicinity toward the center of the wafer chuck 130 as a gas curtain.

As an example, in FIG. 16A, the peripheral purging nozzle 342 may have only one portion for jetting the purging gas. As another example, in FIG. 16B, the peripheral purging nozzle 342 may have a plurality of portions for jetting the purging gas.

As shown in FIG. 15, in the idle state of the deposition equipment 10, small portion of the peripheral purging nozzle 342 and the horizontal curtain section 322 included in the processing gas shielding section 300 may be disposed between the upper plate 120 and the wafer chuck 130, and the horizontal curtain section 322 may prevent the processing gas from being adsorbed to the upper surface 130a of the wafer chuck.

Figure 17:
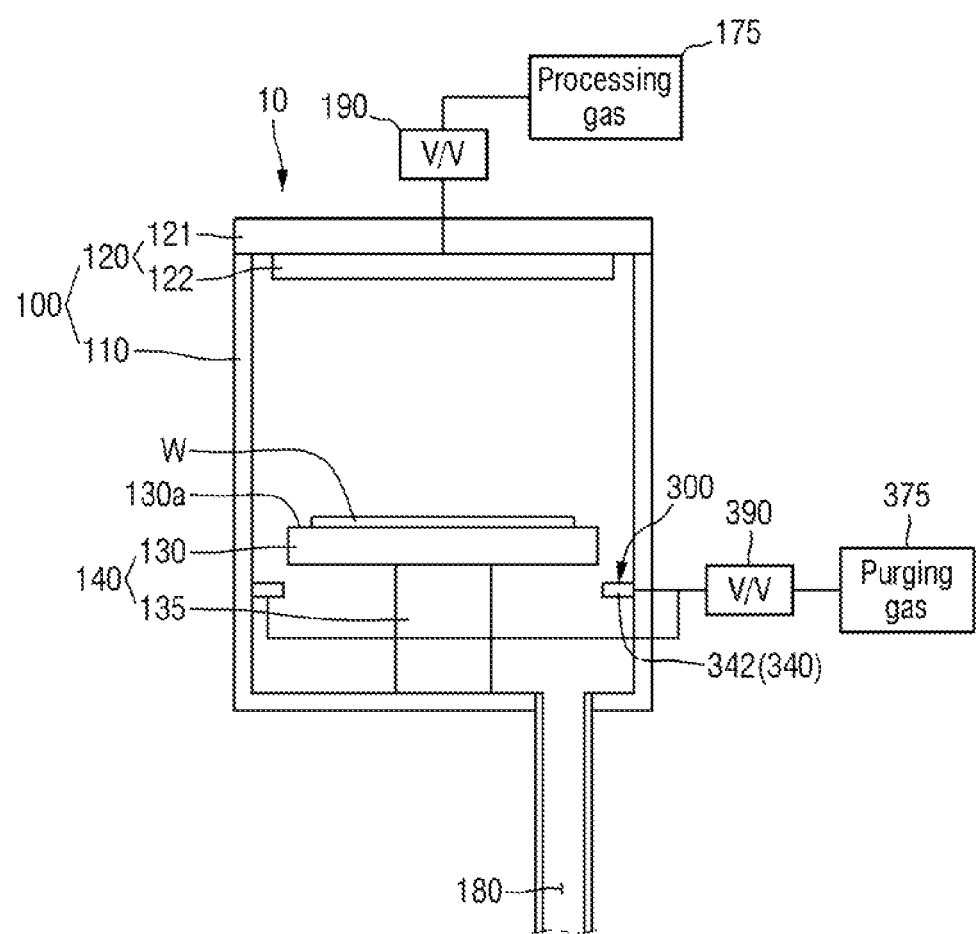
FIGS. 17 and 18 are diagrams for explaining the deposition equipment according to an exemplary embodiment of the present inventive concept.
Figure 18:
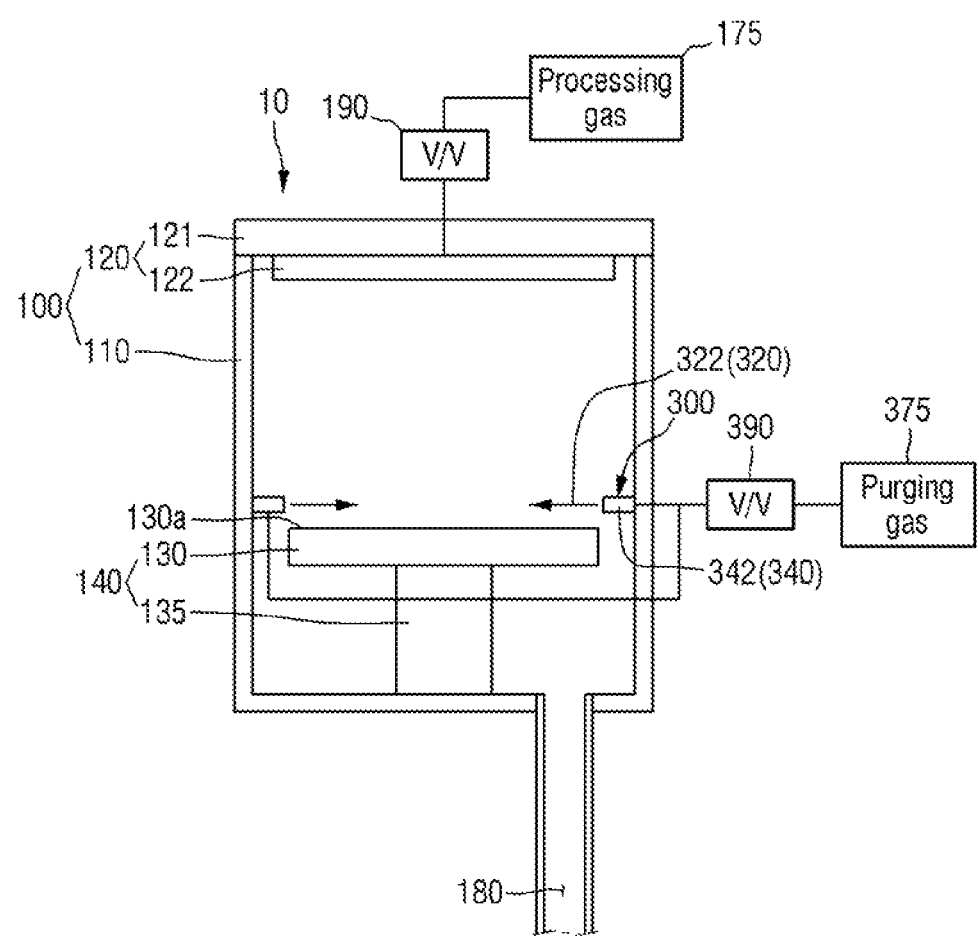

FIGS. 17 and 18 are diagrams for explaining the deposition equipment according to an exemplary embodiment of the present inventive concept. For the sake of convenience of explanation, differences from those described with reference to FIGS. 14 to 16B will be mainly described.

For reference, FIG. 17 is a schematic view for explaining the deposition equipment in a state in which the wafer is loaded. FIG. 18 is a schematic view for explaining the deposition equipment in a state in which the wafer is unloaded.

Referring to FIGS. 17 and 18, in the deposition equipment according to an exemplary embodiment of the present inventive concept, the peripheral purging nozzle 342 may be connected to the side wall of the reaction chamber 100.

The peripheral purging nozzle 342 connected to the side wall of the reaction chamber 100 may move up and down along the side wall of the reaction chamber 100.

As shown in FIG. 18, in the idle state of the deposition equipment 10, the horizontal curtain section 322 included in the processing gas shielding section 300 may be disposed between the upper plate 120 and the wafer chuck 130 to prevent the processing gas from being adsorbed to the upper surface 130a of the wafer chuck.

Figure 19:
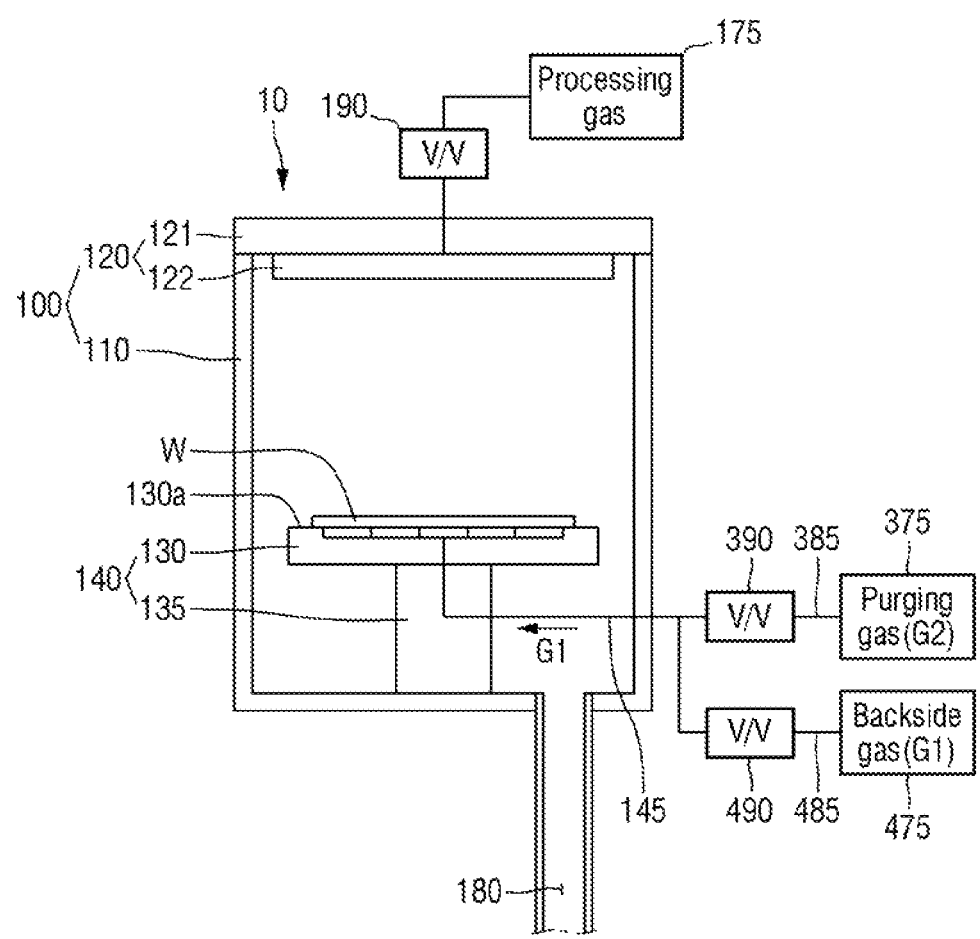
FIGS. 19 to 21 are diagrams for explaining the deposition equipment according to an exemplary embodiment of the present inventive concept.
Figure 20:
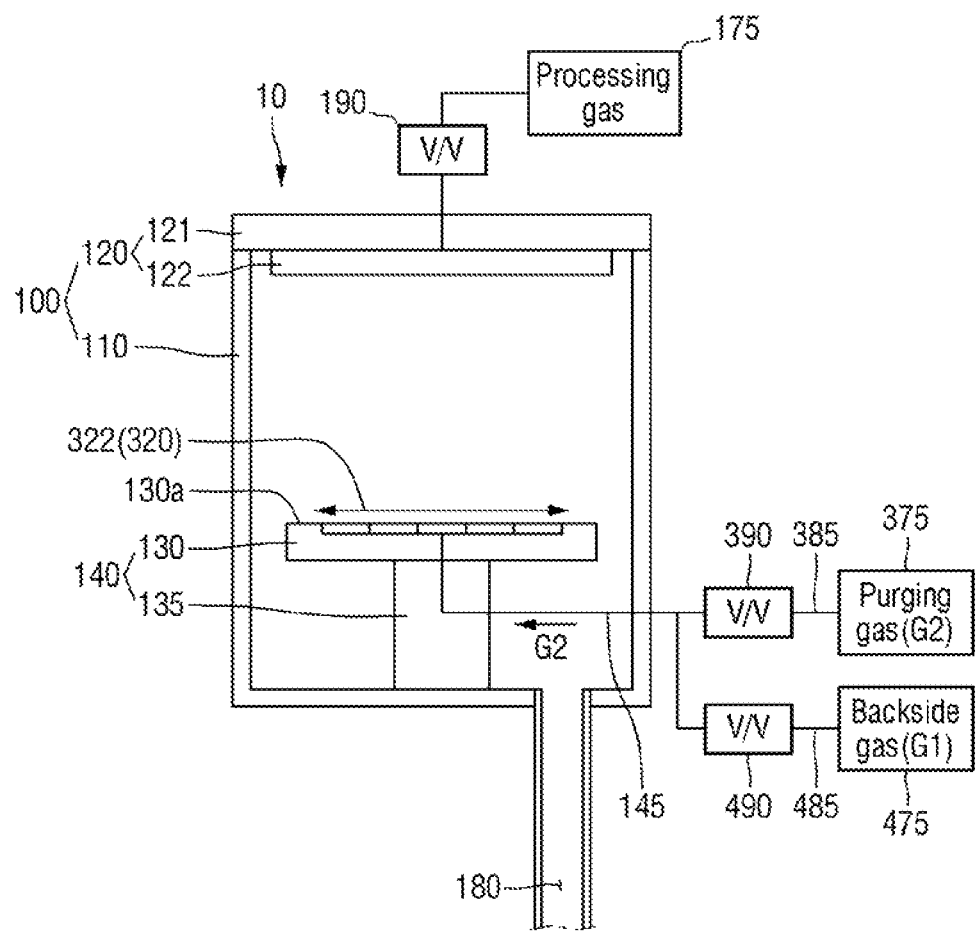
Figure 21:
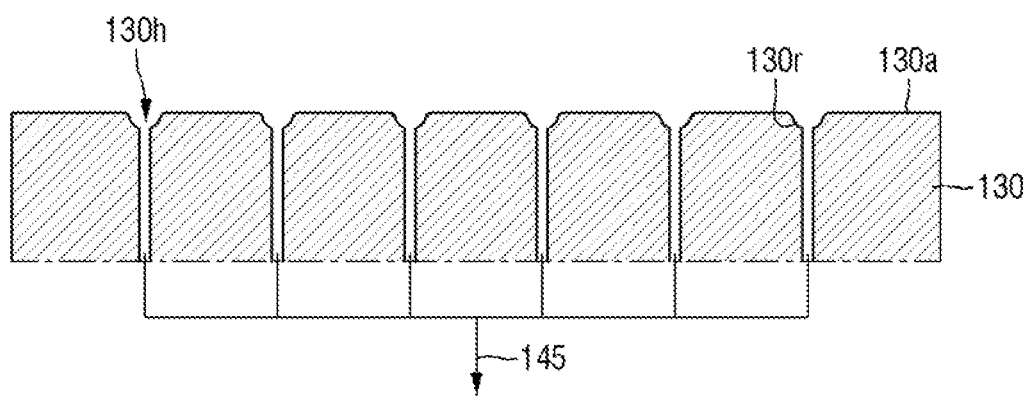

FIGS. 19 to 21 are diagrams for explaining the deposition equipment according to an exemplary embodiment of the present inventive concept.

For reference, FIG. 19 is a schematic view for explaining the deposition equipment in a state in which the wafer is loaded. FIG. 20 is a schematic view for explaining the deposition equipment in a state in which the wafer is unloaded. FIG. 21 is an enlarged view of a part of the wafer chuck 130 of FIGS. 19 and 20.

In the exemplary embodiments to be described below, the repeated components of those described with reference to FIGS. 1 to 18 will be omitted or briefly described.

Referring to FIGS. 19 to 21, the deposition equipment according to an exemplary embodiment of the present inventive concept may include a reaction chamber 100, a wafer chuck 130, a first gas line 485, a second gas line 385, a purging gas supply unit 375, and a backside gas supply unit 475.

The wafer W may be loaded onto the wafer chuck 130, and may be loaded on the upper surface 130a of the wafer chuck. The upper surface 130a of the wafer chuck may face the gas supplier 122.

The wafer chuck 130 may include a plurality of chuck gas holes 130h formed on the upper surface 130a of the wafer chuck, and a plurality of recess regions 130r formed on the upper surface 130a of the wafer chuck. For example, the plurality of chuck gas holes 130h may be formed in the plurality of recess regions 130r.

The first gas line 485 may be connected to the backside gas supply unit 475. A backside gas G1 provided from the backside gas supply unit 475 may pass through the first gas line 485. The backside gas G1 may include, but is not limited to, for example, an inert gas and may include, for example, helium (He), argon (Ar) or nitrogen ($N_2$).

The first gas line 485 may provide the backside gas G1 to the upper surface 130a of the wafer chuck.

When the deposition equipment 10 is in the active state which is a state in which the wafer W is loaded on the wafer chuck 130, the backside gas G1 provided from the backside gas supply unit 475 may provide stability of the deposition step. For example, the backside gas G1 may keep the temperature of the wafer W uniform during the deposition step.

The second gas line 385 may be connected to the purging gas supply unit 375. The purging gas G2 provided from the purging gas supply unit 375 may pass through the second gas line 385.

The second gas line 385 may provide the purging gas G2 to the upper surface 130a of the wafer chuck.

When the deposition equipment 10 is in the idle state which is a state in which the wafer W is removed from the wafer chuck 130, the purging gas G2 provided from the purging gas supply unit 375 may prevent the processing gas injected from the gas supplier 122 from being adsorbed to the upper surface 130a of the wafer chuck.

In the active state of the deposition equipment 10, the backside gas G1 having passed through the first gas line 485 may be jetted to the upper surface 130a of the wafer chuck by the plurality of chuck gas holes 130h.

In the idle state of the deposition equipment 10, the purging gas 02 having passed through the second gas line 385 may be jetted to the upper surface 130a of the wafer chuck by the plurality of chuck gas holes 130h.

A connection gas line 145 may meet the first gas line 485 and the second gas line 385, and may be connected to the plurality of chuck gas holes 130h. One of the backside gas G1 and the purging gas G2 having passed through the connection gas line 145 may be jetted to the upper surface 130a of the wafer chuck by the plurality of chuck gas holes 130h.

A backside gas valve 490 may adjust provision of the backside gas G1 to the connection gas line 145. The purging gas valve 390 may adjust provision of the purging gas G2 to the connection gas line 145.

A separate mass flow controller (MFC) may be disposed in the first gas line 485 through which the backside gas G1 flows to adjust the flow rate of the backside gas G1. Further, a separate mass flow meter (MFC) may be disposed in the second gas line 385 through which the purging gas G2 flows to adjust the flow rate of the purging gas G2.

In the active state of the deposition equipment 10, the backside gas valve 490 is opened and the purging gas valve 390 may be closed. As a result, in the active state of the deposition equipment 10, the backside gas G1 having passed through the connection gas line 145 may be jetted to the upper surface 130*a* of the wafer chuck by the plurality of chuck gas holes 130*h*.

In the idle state of the deposition equipment 10, the backside gas valve 490 may be closed and the purging gas valve 390 may be opened. Thus, in the idle state of the deposition equipment 10, the purging gas G2 having passed through the connection gas line 145 may be jetted to the upper surface 130*a* of the wafer chuck by the plurality of chuck gas holes 130*h*. The purging gas G2 jetted by the plurality of chuck gas holes 130*h* may form the curtain section 320 of the processing gas shielding section on the upper surface 130*a* of the wafer chuck. That is, the purging gas G2 jetted by the plurality of chuck gas holes 130*h* may form the horizontal curtain section 322 on the wafer chuck 130. The horizontal curtain section 322 may prevent the processing gas from being adsorbed to the upper surface 130*a* of the wafer chuck, and thus a thin film such as a metal thin film may not be deposited on the upper surface 130*a* of the wafer chuck, and the wafer chuck 130 may not be contaminated.

Figure 22:
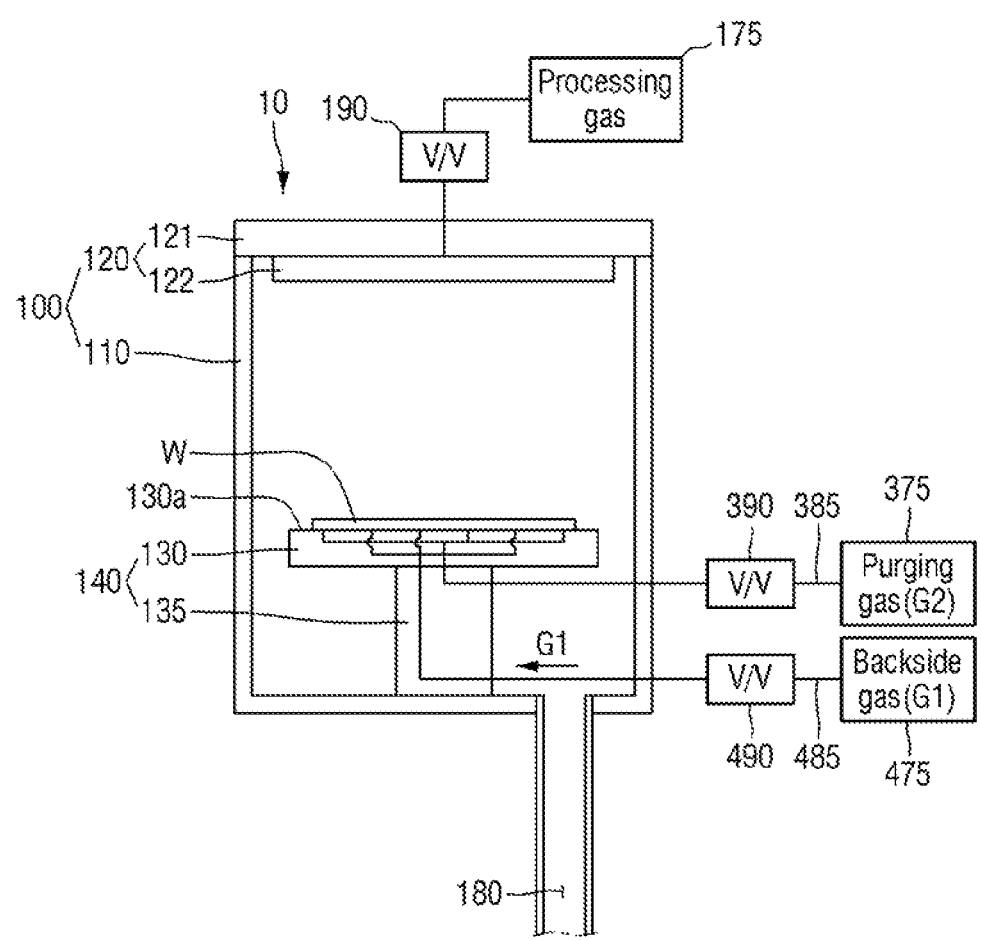
FIGS. 22 to 24 are diagrams for explaining the deposition equipment according to an exemplary embodiment of the present inventive concept.
Figure 23:
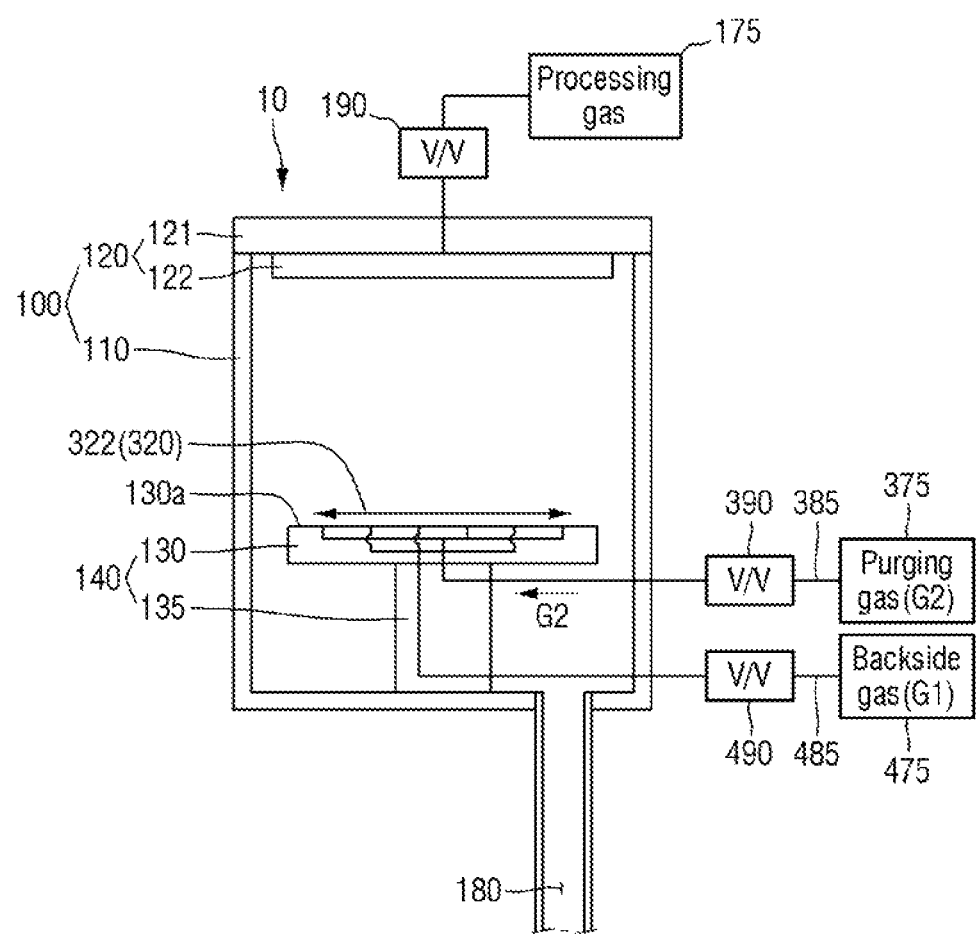
Figure 24:
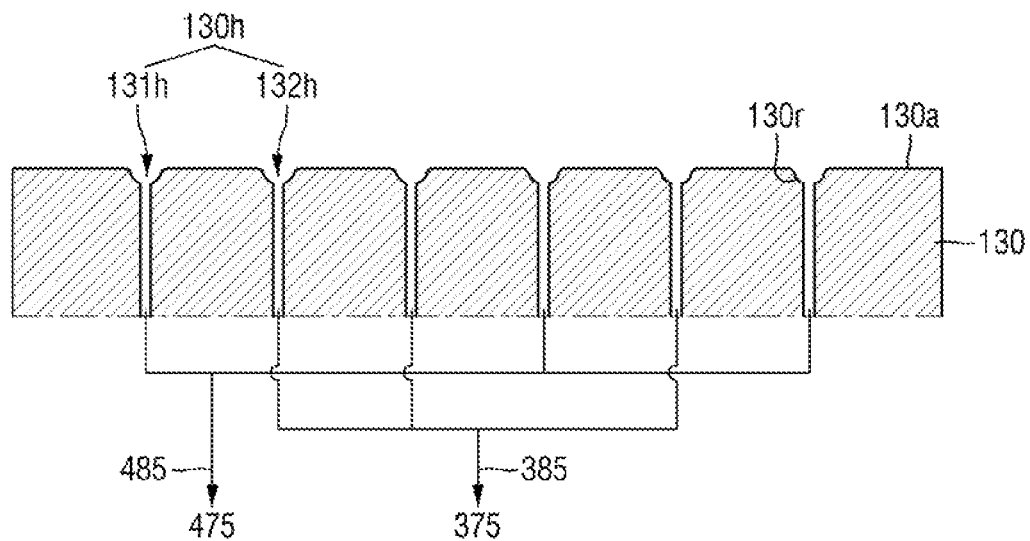

FIGS. 22 to 24 are diagrams for explaining the deposition equipment according to an exemplary embodiment of the present inventive concept. For the sake of convenience of explanation, differences from those described with reference to FIGS. 19 to 21 will be mainly described.

For reference, FIG. 22 is a schematic view for explaining the deposition equipment in a state in which the wafer is loaded. FIG. 23 is a schematic view for explaining the deposition equipment in a state in which the wafer is unloaded. FIG. 24 is an enlarged view of a part of the wafer chuck 130 of FIGS. 22 and 23.

Referring to FIGS. 22 to 24, in the deposition equipment according to an exemplary embodiment of the present inventive concept, the plurality of chuck gas holes 130*h* include a first gas hole 131*h* for jetting the backside gas G1, and a second gas hole 132*h* for injecting the purging gas G2.

The first gas hole 131*h* is connected to the first gas line 485 and is not connected to the second gas line 385.

The second gas hole 132*h* is connected to the second gas line 385 and is not connected to the first gas line 485.

The first gas hole 131*h* and the second gas hole 132*h* may be formed in a plurality of recess regions 130*r*.

Figure 25:
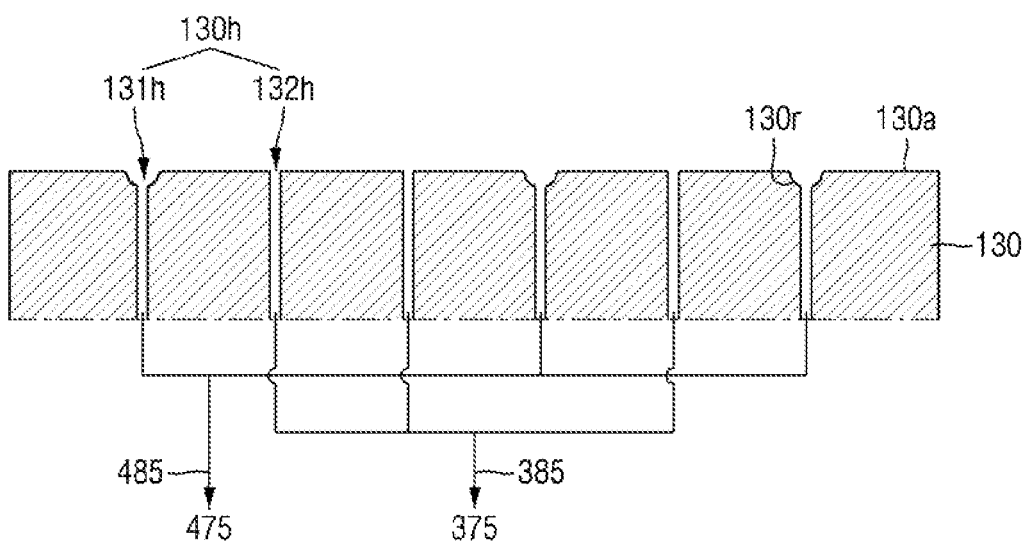
FIG. 25 is a diagram for explaining the deposition equipment according to an exemplary embodiment of the present inventive concept.

FIG. 25 is a diagram for explaining the deposition equipment according to an exemplary embodiment of the present inventive concept. For the sake of convenience of explanation, differences from those described with reference to FIGS. 22 to 24 will be mainly described.

For reference, FIG. 25 is an enlarged view of a part of the wafer chuck 130 of FIGS. 22 and 23.

Referring to FIG. 25, in the deposition equipment according to an exemplary embodiment of the present inventive concept, the first gas hole 131*h* is formed in the recess region 130*r*, and the second gas hole 132*h* is not formed in the recess region 130*r*.

As shown in FIG. 23, in the idle state of the deposition equipment 10, the backside gas valve 490 may be closed and the purging gas valve 390 may be opened. Thus, in the idle state of the deposition equipment 10, the purging gas G2 may be jetted to the upper surface 130*a* of the wafer chuck by the plurality of second gas holes 132*h*. The purging gas G2 jetted by the plurality of second gas holes 132*h* may form the curtain section 320 of the processing gas shielding section on the upper surface 130*a* of the wafer chuck. That is, the purging gas G2 jetted by the plurality of second gas holes 132*h* may form the horizontal curtain section 322 on the wafer chuck 130. The horizontal curtain section 322 may prevent the processing gas from being adsorbed to the upper surface 130*a* of the wafer chuck, and thus a thin film such as a metal thin film may not be deposited on the upper surface 130*a* of the wafer chuck, and the wafer chuck 130 may not be contaminated.

Figure 26:
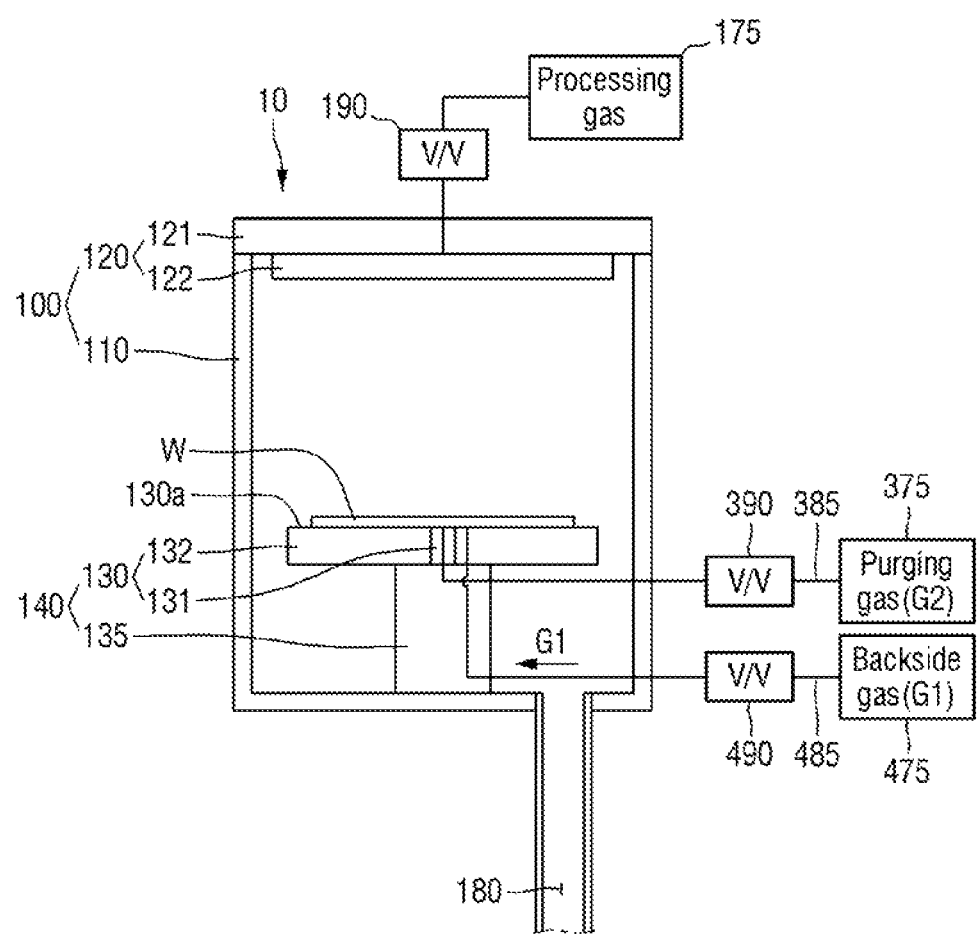
FIGS. 26 and 27 are diagrams for explaining the deposition equipment according to an exemplary embodiment of the present inventive concept.
Figure 27:
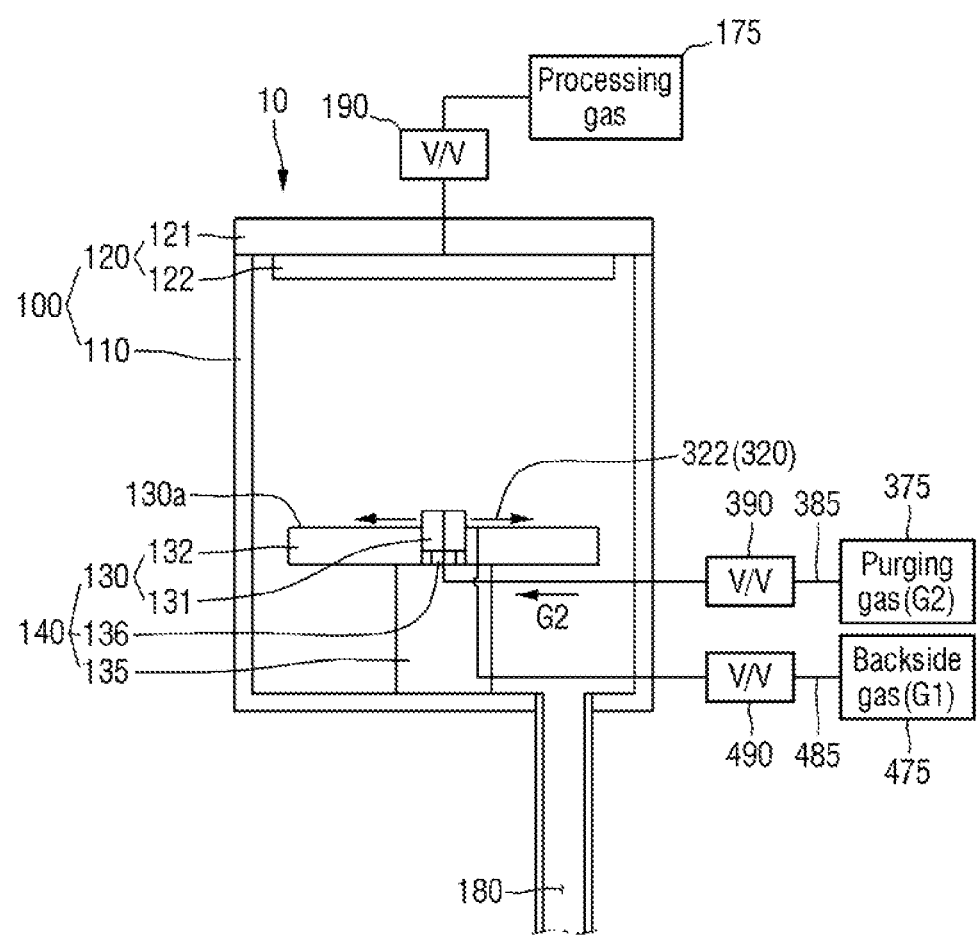

FIGS. 26 and 27 are diagrams for explaining the deposition equipment according to an exemplary embodiment of the present inventive concept. For the sake of convenience of explanation, differences from those described with reference to FIGS. 22 to 24 will be mainly described.

For reference, FIG. 26 is a schematic view for explaining the deposition equipment in a state in which the wafer is loaded. FIG. 27 is a schematic view for explaining the deposition equipment in a state in which the wafer is unloaded.

Referring to FIGS. 26 and 27, in the deposition equipment according to an exemplary embodiment of the present inventive concept, the wafer chuck 130 includes a central section 131, and a peripheral section 132 disposed around the central section 131.

The central section 131 of the wafer chuck may perform a relative vertical movement with respect to the peripheral section 132 of the wafer chuck, by the vertical drive unit 136 included in the wafer loading unit 140. For example, the central section 131 of the wafer chuck may be movable upward and downward relative to the peripheral section 132 of the wafer chuck.

The central section 131 of the wafer chuck may be connected to a purging gas supply unit 375 for providing the purging gas G2. The peripheral section 132 of the wafer chuck may be connected to the backside gas supply unit 475 which provides the backside gas G1.

When the deposition equipment 10 is in the active state which is a state in which the wafer W is loaded on the wafer chuck 130, the upper surface of the central section 131 of the wafer chuck may be placed on a plane substantially the same as that of the upper surface of the peripheral section 132 of the wafer chuck.

On the other hand, when the deposition equipment 10 is in the idle state which is a state in which the wafer W is removed from the wafer chuck 130, the central section 131 of the wafer chuck may protrude toward the upper plate 120 beyond the peripheral section 132 of the wafer chuck.

The protruding central section 131 of the wafer chuck may jet the purging gas G2 to the upper surface 130*a* of the wafer chuck. Accordingly, the horizontal curtain section 322 may be formed on the upper surface 130*a* of the wafer chuck. The horizontal curtain section 322 may prevent the processing gas from being adsorbed to the upper surface 130*a* of the wafer chuck.

Figure 28:
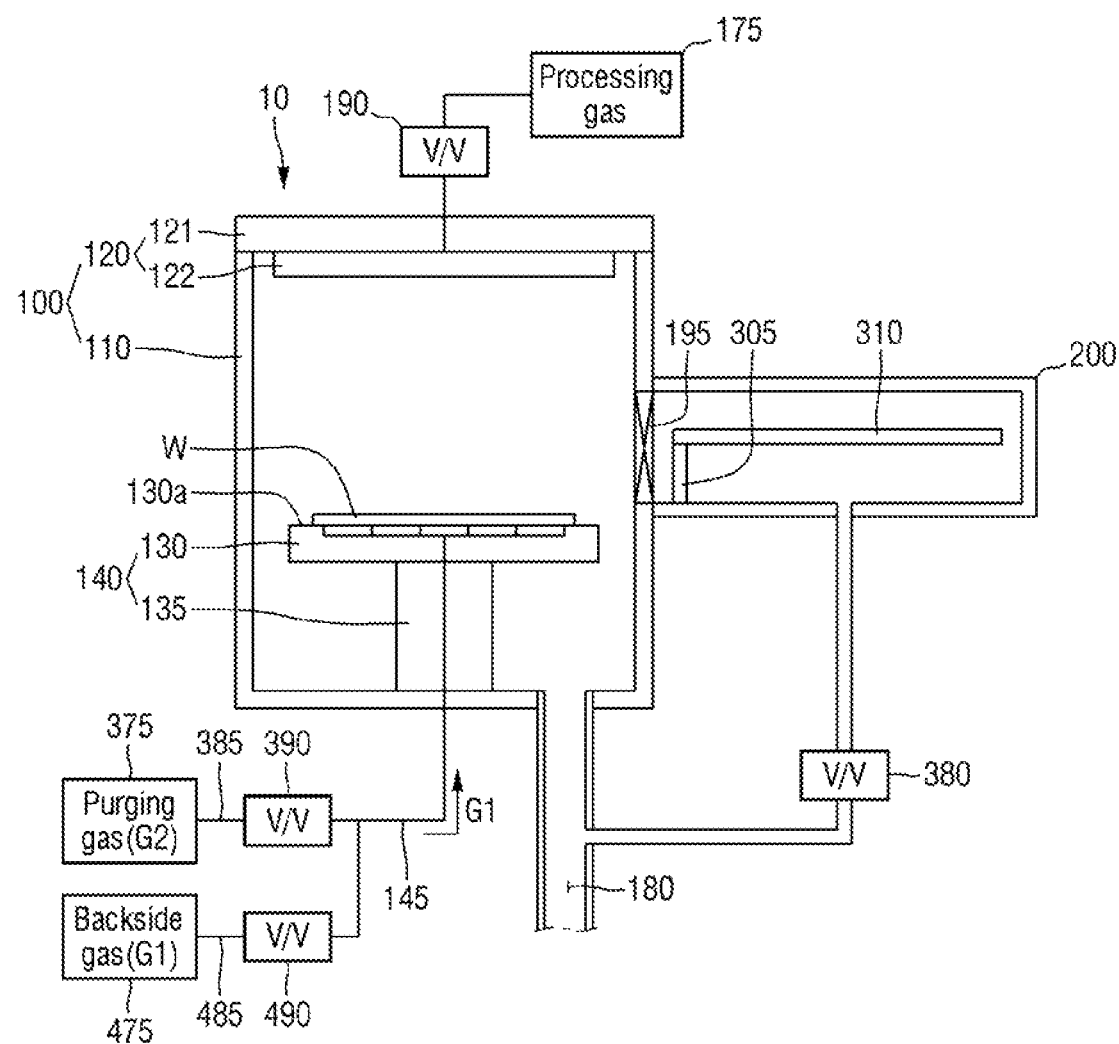
FIGS. 28 and 29 are diagrams for explaining the deposition equipment according to an exemplary embodiment of the present inventive concept.
Figure 29:
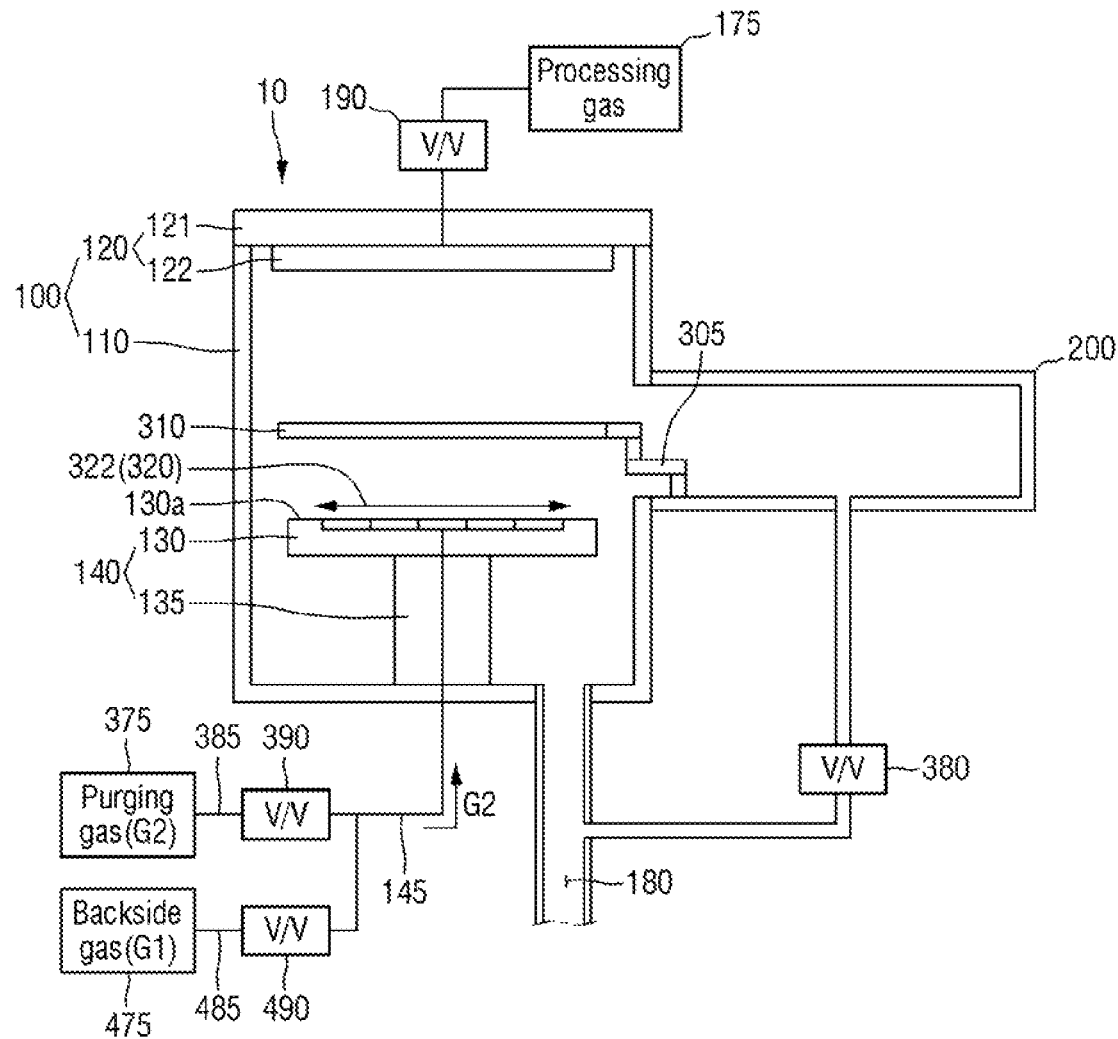

FIGS. 28 and 29 are diagrams for explaining the deposition equipment according to an exemplary embodiment of the present inventive concept. For the sake of convenience of explanation, differences from those described with reference to FIGS. 19 to 21 will be mainly described.

For reference, FIG. 28 is a schematic view for explaining the deposition equipment in a state in which the wafer is loaded. FIG. 29 is a schematic view for explaining the deposition equipment in a state in which the wafer is unloaded.

The exemplary embodiment of the present inventive concept described with reference to FIGS. 28 and 29 may be applied to the exemplary embodiment described with reference to FIGS. 19 to 27.

Referring to FIGS. 28 and 29, the deposition equipment 10 according to an exemplary embodiment of the present inventive concept includes a shutter 310 disposed between the gas supplier 122 and the wafer chuck 130.

When the deposition equipment 10 is in the active state, the shutter 310 may be located in the storage chamber 200.

As shown in FIG. 29, when the deposition equipment 10 is in the idle state which is a state in which the wafer W is removed, the shutter 310 may move into the reaction chamber 100. The shutter 310 moved into the reaction chamber 100 may be placed on the upper surface 130a of the wafer chuck. In addition, similar to FIG. 20, the purging gas G2 may be jetted to the upper surface 130a of the wafer chuck to form the curtain section 320 of the processing gas shielding section on the upper surface 130a of the wafer chuck. That is, the purging gas G2 jetted may form the horizontal curtain section 322 on the wafer chuck 130. The horizontal curtain section 322 and the shutter 310 may prevent the processing gas from being adsorbed to the upper surface 130a of the wafer chuck, and thus a thin film such as a metal thin film may not be deposited on the upper surface 130a of the wafer chuck, and the wafer chuck 130 may not be contaminated.

Figure 30:
FIGS. 30 and 31 are diagrams for explaining a method of fabricating the semiconductor device according to an exemplary embodiment of the present inventive concept.
Figure 31:
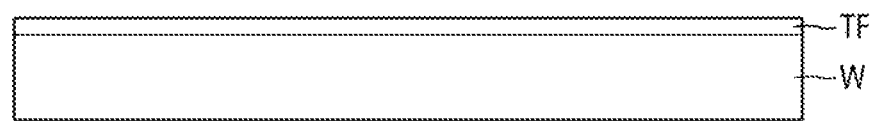

FIGS. 30 and 31 are diagrams for explaining a method of fabricating the semiconductor device according to an exemplary embodiment of the present inventive concept.

The deposition equipment according to the exemplary embodiments of the present inventive concept described with reference to FIGS. 1 to 29 may be used in the method for fabricating the semiconductor device described with reference to FIGS. 30 and 31.

The following description will be provided with reference to FIGS. 1 and 2.

Referring to FIGS. 1 and 30, the wafer W is loaded on the upper surface 130a of the wafer chuck in the deposition equipment 10.

After the wafer W is loaded, the processing gas provided from the processing gas supply unit 175 is injected into the reaction chamber 100 via the gas supplier 122.

Referring to FIGS. 1 and 31, a thin film TF is formed on the wafer W, using the processing gas in the reaction chamber 100.

Referring to FIGS. 2 and 31, after the thin film TF is formed, the wafer W is removed from the wafer chuck 130. The wafer W removed from the wafer chuck 130 is discharged to the outside of the reaction chamber 100.

In concluding the detailed description, those skilled in the art will appreciate that many variations and modifications may be made to the preferred exemplary embodiments without departing from the spirit and scope of the present inventive concept. Therefore, the disclosed preferred exemplary embodiments of the present inventive concept are used in a generic and descriptive sense only and not for purposes of limitation.

What is claimed is:

1. A deposition equipment comprising:
a reaction chamber including an upper plate and a container body, the upper plate including a gas supplier for injecting a processing gas;
a wafer chuck including an upper surface on which a wafer is loaded, in the reaction chamber, with the upper surface of the wafer chuck facing the upper plate; and
a processing gas shielding section which prevents the processing gas from being adsorbed to the upper surface of the wafer chuck and is disposed between the upper plate and the wafer chuck in a state in which the wafer is removed from the wafer chuck,
wherein the processing gas shielding section includes a shutter which is plate-like,
the shutter includes a first region, a second region, and a third region between the first region and the second region, and
the first region of the shutter includes a gas discharge section for jetting a purging gas toward the wafer chuck, and the third region of the shutter does not include a gas discharge section for jetting the purging gas toward the wafer chuck.

2. The deposition equipment of claim 1, wherein the third region of the shutter is defined along a periphery of the first region of the shutter, and
the second region of the shutter is defined along a periphery of the third region of the shutter.

3. The deposition equipment of claim 2, wherein the first region of the shutter includes a gas nozzle which protrudes toward the wafer chuck.

4. The deposition equipment of claim 1, wherein the third region of the shutter is defined along a periphery of the second region of the shutter, and
the first region of the shutter is defined along a periphery of the third region of the shutter.

5. The deposition equipment of claim 1, further comprising:
a storage chamber which is connected to the reaction chamber and stores the processing gas shielding section.

6. The deposition equipment of claim 5, wherein the processing gas shielding section is stored in the storage chamber during deposition of a thin film on the wafer.

7. The deposition equipment of claim 5, wherein the processing gas shielding section is cleaned in the storage chamber.

8. Deposition equipment comprising:
a reaction chamber including an upper plate and a container body, the upper plate including a gas supplier for injecting a processing gas;
a wafer chuck including an upper surface on which a wafer is loaded, in the reaction chamber, with the upper surface of the wafer chuck facing the upper plate; and
a processing gas shielding section which prevents the processing gas from being adsorbed to the upper surface of the wafer chuck and is disposed between the upper plate and the wafer chuck in a state in which the wafer is removed from the wafer chuck,
wherein the processing gas shielding section includes a gas nozzle which jets a purging gas with no processing gas onto the upper surface of the wafer chuck,
the processing gas shielding section is connected to a purging gas supply unit but not connected to a processing gas supply unit, and
a portion of the gas nozzle for injecting the purging gas is disposed on a central section of the wafer chuck.

9. The deposition equipment of claim 8, wherein the processing gas shielding section includes a shutter disposed between the gas supplier and the wafer chuck, and
the gas nozzle is connected to the shutter.

10. The deposition equipment of claim 8, wherein the gas nozzle is connected to a side wall of the reaction chamber.

11. The deposition equipment of claim 8, further comprising:
a lower structure disposed along a periphery of the wafer chuck,
wherein the gas nozzle is connected to the lower structure.

* * * * *